(12) United States Patent
Zheng et al.

(10) Patent No.: US 7,235,138 B2
(45) Date of Patent: Jun. 26, 2007

(54) MICROFEATURE WORKPIECE PROCESSING APPARATUS AND METHODS FOR BATCH DEPOSITION OF MATERIALS ON MICROFEATURE WORKPIECES

(75) Inventors: Lingyi A. Zheng, Boise, ID (US); Trung T. Doan, Pflugerville, TX (US); Lyle D. Breiner, Meridian, ID (US); Er-Xuan Ping, Meridian, ID (US); Ronald A. Weimer, Boise, ID (US); David J. Kubista, Nampa, ID (US); Kevin L. Beaman, Boise, ID (US); Cem Basceri, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 266 days.

(21) Appl. No.: 10/646,607

(22) Filed: Aug. 21, 2003

(65) Prior Publication Data

US 2005/0039686 A1 Feb. 24, 2005

(51) Int. Cl.
*C23C 16/00* (2006.01)
*H01L 21/306* (2006.01)
*C23F 1/00* (2006.01)

(52) U.S. Cl. .................. 118/728; 156/345.51; 118/725; 206/832

(58) Field of Classification Search ........... 156/345.23, 156/345.33; 118/728
See application file for complete search history.

(56) References Cited

U.S. PATENT DOCUMENTS

| | | | |
|---|---|---|---|
| 579,269 A | 3/1897 | Hent | |
| 3,618,919 A | 11/1971 | Beck | |
| 3,620,934 A | 11/1971 | Endle | |
| 3,630,769 A | 12/1971 | Hart et al. | |
| 3,630,881 A | 12/1971 | Lester et al. | |
| 3,634,212 A | 1/1972 | Valayll et al. | |
| 4,018,949 A | 4/1977 | Donokowski et al. | |
| 4,242,182 A | 12/1980 | Popescu | |
| 4,269,625 A | 5/1981 | Molenaar | |
| 4,289,061 A | 9/1981 | Emmett | |
| 4,313,783 A | 2/1982 | Davies et al. | |
| 4,397,753 A | 8/1983 | Czaja | |

(Continued)

FOREIGN PATENT DOCUMENTS

DE 198 51 824 A1 5/2000

(Continued)

OTHER PUBLICATIONS

U.S. Appl. No. 10/767,298, filed Jan. 28, 2004 Zheng et al.

(Continued)

*Primary Examiner*—Ram N. Kackar
*Assistant Examiner*—Rakesh K Dhingra
(74) *Attorney, Agent, or Firm*—Perkins Coie LLP

(57) ABSTRACT

The present disclosure describes apparatus and methods for processing microfeature workpieces, e.g., by depositing material on a microelectronic semiconductor using atomic layer deposition. Some of these apparatus include microfeature workpiece holders that include gas distributors. One exemplary implementation provides a microfeature workpiece holder adapted to hold a plurality of microfeature workpieces. This workpiece holder includes a plurality of workpiece supports and a gas distributor. The workpiece supports are adapted to support a plurality of microfeature workpieces in a spaced-apart relationship to define a process space adjacent a surface of each microfeature workpiece. The gas distributor includes an inlet and a plurality of outlets, with each of the outlets positioned to direct a flow of process gas into one of the process spaces.

20 Claims, 12 Drawing Sheets

U.S. PATENT DOCUMENTS

| | | |
|---|---|---|
| 4,438,724 A | 3/1984 | Doehler et al. |
| 4,469,801 A | 9/1984 | Hirai et al. |
| 4,545,136 A | 10/1985 | Izu et al. |
| 4,590,042 A | 5/1986 | Drage |
| 4,593,644 A | 6/1986 | Hanak |
| 4,681,777 A | 7/1987 | Engelken et al. |
| 4,826,579 A | 5/1989 | Westfall |
| 4,911,638 A * | 3/1990 | Bayne et al. ............... 432/152 |
| 4,948,979 A | 8/1990 | Munakata et al. |
| 4,949,669 A | 8/1990 | Ishii et al. |
| 4,966,646 A | 10/1990 | Zdeblick |
| 4,977,106 A | 12/1990 | Smith |
| 5,017,404 A | 5/1991 | Paquet et al. |
| 5,020,476 A * | 6/1991 | Bay et al. .................. 118/728 |
| 5,076,205 A | 12/1991 | Vowles et al. |
| 5,091,207 A | 2/1992 | Tanaka |
| 5,131,752 A | 7/1992 | Yu et al. |
| 5,136,975 A | 8/1992 | Bartholomew et al. |
| 5,172,849 A | 12/1992 | Barten et al. |
| 5,200,023 A | 4/1993 | Gifford et al. |
| 5,223,113 A | 6/1993 | Kaneko et al. |
| 5,232,749 A | 8/1993 | Gilton |
| 5,248,527 A | 9/1993 | Uchida et al. |
| 5,325,020 A | 6/1994 | Campbell et al. |
| 5,364,219 A | 11/1994 | Takahashi et al. |
| 5,377,429 A | 1/1995 | Sandhu et al. |
| 5,380,396 A | 1/1995 | Shikida et al. |
| 5,409,129 A | 4/1995 | Tsukada et al. |
| 5,418,180 A | 5/1995 | Brown |
| 5,427,666 A | 6/1995 | Mueller et al. |
| 5,433,787 A | 7/1995 | Suzuki et al. |
| 5,433,835 A | 7/1995 | Demaray et al. |
| 5,445,491 A | 8/1995 | Nakagawa et al. |
| 5,480,818 A | 1/1996 | Matsumoto et al. |
| 5,498,292 A | 3/1996 | Ozaki |
| 5,500,256 A | 3/1996 | Watabe |
| 5,522,934 A | 6/1996 | Suzuki et al. |
| 5,536,317 A | 7/1996 | Crain et al. |
| 5,562,800 A | 10/1996 | Kawamura |
| 5,589,002 A | 12/1996 | Su |
| 5,592,581 A | 1/1997 | Okase |
| 5,595,606 A | 1/1997 | Fujikawa et al. |
| 5,599,513 A | 2/1997 | Masaki et al. |
| 5,624,498 A | 4/1997 | Lee et al. |
| 5,626,936 A | 5/1997 | Alderman |
| 5,640,751 A | 6/1997 | Faria |
| 5,643,394 A | 7/1997 | Maydan et al. |
| 5,654,589 A | 8/1997 | Huang et al. |
| 5,693,288 A | 12/1997 | Nakamura |
| 5,729,896 A | 3/1998 | Dalal et al. |
| 5,746,434 A | 5/1998 | Boyd et al. |
| 5,766,364 A | 6/1998 | Ishida et al. |
| 5,769,950 A | 6/1998 | Takasu et al. |
| 5,769,952 A | 6/1998 | Komino |
| 5,788,778 A | 8/1998 | Shang et al. |
| 5,792,269 A | 8/1998 | Deacon et al. |
| 5,792,700 A | 8/1998 | Turner et al. |
| 5,819,683 A | 10/1998 | Ikeda et al. |
| 5,820,641 A | 10/1998 | Gu et al. |
| 5,827,370 A | 10/1998 | Gu |
| 5,833,888 A | 11/1998 | Arya et al. |
| 5,846,275 A | 12/1998 | Lane et al. |
| 5,846,330 A | 12/1998 | Quirk et al. |
| 5,851,849 A | 12/1998 | Comizzoli et al. |
| 5,865,417 A | 2/1999 | Harris et al. |
| 5,866,986 A | 2/1999 | Pennington |
| 5,879,459 A | 3/1999 | Gadgil et al. |
| 5,895,530 A | 4/1999 | Shrotriya et al. |
| 5,902,403 A | 5/1999 | Aitani et al. |
| 5,908,947 A | 6/1999 | Vaartstra |
| 5,932,286 A | 8/1999 | Beinglass et al. |
| 5,953,634 A | 9/1999 | Kajita et al. |
| 5,956,613 A | 9/1999 | Zhao et al. |
| 5,968,587 A | 10/1999 | Frankel |
| 5,972,430 A | 10/1999 | DiMeo, Jr. et al. |
| 5,994,181 A | 11/1999 | Hsieh et al. |
| 5,997,588 A | 12/1999 | Goodwin et al. |
| 6,006,694 A | 12/1999 | DeOrnellas et al. |
| 6,008,086 A | 12/1999 | Schuegraf et al. |
| 6,022,483 A | 2/2000 | Aral |
| 6,032,923 A | 3/2000 | Biegelsen et al. |
| 6,042,652 A | 3/2000 | Hyun et al. |
| 6,045,620 A | 4/2000 | Tepman et al. |
| 6,059,885 A | 5/2000 | Ohashi et al. |
| 6,062,256 A | 5/2000 | Miller et al. |
| 6,070,551 A | 6/2000 | Li et al. |
| 6,079,426 A | 6/2000 | Subrahmanyam et al. |
| 6,080,446 A | 6/2000 | Tobe et al. |
| 6,086,677 A | 7/2000 | Umotoy et al. |
| 6,089,543 A | 7/2000 | Freerks |
| 6,109,206 A | 8/2000 | Maydan et al. |
| 6,113,698 A | 9/2000 | Raaijmakers et al. |
| 6,123,107 A | 9/2000 | Selser et al. |
| 6,129,331 A | 10/2000 | Henning et al. |
| 6,139,700 A | 10/2000 | Kang et al. |
| 6,143,077 A | 11/2000 | Ikeda et al. |
| 6,143,078 A | 11/2000 | Ishikawa et al. |
| 6,143,659 A | 11/2000 | Leem |
| 6,144,060 A | 11/2000 | Park et al. |
| 6,149,123 A | 11/2000 | Harris et al. |
| 6,159,298 A | 12/2000 | Saito |
| 6,160,243 A | 12/2000 | Cozad |
| 6,161,500 A | 12/2000 | Kopacz et al. |
| 6,173,673 B1 | 1/2001 | Golovato et al. |
| 6,174,366 B1 | 1/2001 | Ihantola |
| 6,174,377 B1 | 1/2001 | Doering et al. |
| 6,174,809 B1 | 1/2001 | Kang et al. |
| 6,178,660 B1 | 1/2001 | Emmi et al. |
| 6,182,603 B1 | 2/2001 | Shang et al. |
| 6,192,827 B1 | 2/2001 | Welch et al. |
| 6,193,802 B1 | 2/2001 | Pang et al. |
| 6,194,628 B1 | 2/2001 | Pang et al. |
| 6,197,119 B1 | 3/2001 | Dozoretz et al. |
| 6,200,415 B1 | 3/2001 | Maraschin |
| 6,203,613 B1 | 3/2001 | Gates et al. |
| 6,206,972 B1 | 3/2001 | Dunham |
| 6,207,937 B1 | 3/2001 | Stoddard et al. |
| 6,210,754 B1 | 4/2001 | Lu et al. |
| 6,211,033 B1 | 4/2001 | Sandhu et al. |
| 6,211,078 B1 | 4/2001 | Matthews |
| 6,214,714 B1 | 4/2001 | Wang et al. |
| 6,237,394 B1 | 5/2001 | Harris et al. |
| 6,237,529 B1 | 5/2001 | Spahn |
| 6,245,192 B1 | 6/2001 | Dhindsa et al. |
| 6,255,222 B1 | 7/2001 | Xia et al. |
| 6,263,829 B1 | 7/2001 | Schneider et al. |
| 6,270,572 B1 | 8/2001 | Kim et al. |
| 6,273,954 B2 | 8/2001 | Nishikawa et al. |
| 6,277,763 B1 | 8/2001 | Kugimiya et al. |
| 6,280,584 B1 | 8/2001 | Kumar et al. |
| 6,287,965 B1 | 9/2001 | Kang et al. |
| 6,287,980 B1 | 9/2001 | Hanazaki et al. |
| 6,290,491 B1 | 9/2001 | Shahvandi et al. |
| 6,291,337 B1 | 9/2001 | Sidhwa |
| 6,294,394 B1 | 9/2001 | Erickson et al. |
| 6,297,539 B1 | 10/2001 | Ma et al. |
| 6,302,964 B1 | 10/2001 | Umotoy et al. |
| 6,302,965 B1 | 10/2001 | Umotoy et al. |
| 6,303,953 B1 | 10/2001 | Doan et al. |
| 6,305,314 B1 | 10/2001 | Sneh et al. |
| 6,309,161 B1 | 10/2001 | Hofmeister |
| 6,315,859 B1 | 11/2001 | Donohoe |
| 6,328,803 B2 | 12/2001 | Rolfson et al. |
| 6,329,297 B1 | 12/2001 | Balish et al. |

| | | | | | |
|---|---|---|---|---|---|
| 6,334,928 B1 | 1/2002 | Sekine et al. | 2001/0054484 A1 | 12/2001 | Komino |
| 6,342,277 B1 | 1/2002 | Sherman | 2002/0007790 A1 | 1/2002 | Park |
| 6,346,477 B1 | 2/2002 | Kaloyeros et al. | 2002/0020353 A1 | 2/2002 | Redemann et al. |
| 6,347,602 B2 | 2/2002 | Goto et al. | 2002/0043216 A1 | 4/2002 | Hwang et al. |
| 6,347,918 B1 | 2/2002 | Blahnik | 2002/0052097 A1 | 5/2002 | Park |
| 6,355,561 B1 | 3/2002 | Sandhu et al. | 2002/0073924 A1 | 6/2002 | Chiang et al. |
| 6,358,323 B1 | 3/2002 | Schmitt et al. | 2002/0076490 A1 | 6/2002 | Chiang et al. |
| 6,364,219 B1 | 4/2002 | Zimmerman et al. | 2002/0076507 A1 | 6/2002 | Chiang et al. |
| 6,374,831 B1 | 4/2002 | Chandran et al. | 2002/0076508 A1 | 6/2002 | Chiang et al. |
| 6,383,300 B1 | 5/2002 | Saito et al. | 2002/0094689 A1 | 7/2002 | Park |
| 6,387,185 B2 | 5/2002 | Doering et al. | 2002/0100418 A1 | 8/2002 | Sandhu et al. |
| 6,387,207 B1 | 5/2002 | Janakiraman et al. | 2002/0104481 A1 | 8/2002 | Chiang et al. |
| 6,402,806 B1 | 6/2002 | Schmitt et al. | 2002/0108714 A1 | 8/2002 | Doering et al. |
| 6,402,849 B2 * | 6/2002 | Kwag et al. ............... 118/715 | 2002/0110991 A1 | 8/2002 | Li |
| 6,415,736 B1 | 7/2002 | Hao et al. | 2002/0127745 A1 | 9/2002 | Lu et al. |
| 6,419,462 B1 | 7/2002 | Horie et al. | 2002/0129768 A1 | 9/2002 | Carpernter et al. |
| 6,420,230 B1 | 7/2002 | Derderian et al. | 2002/0144655 A1 | 10/2002 | Chiang et al. |
| 6,420,742 B1 | 7/2002 | Ahn et al. | 2002/0146512 A1 | 10/2002 | Rossman |
| 6,425,168 B1 * | 7/2002 | Takaku .................... 29/25.01 | 2002/0162506 A1 | 11/2002 | Sneh et al. |
| 6,428,859 B1 | 8/2002 | Chiang et al. | 2002/0164420 A1 | 11/2002 | Derderian et al. |
| 6,432,256 B1 | 8/2002 | Raoux | 2002/0185067 A1 | 12/2002 | Upham |
| 6,432,259 B1 | 8/2002 | Noorbaksh et al. | 2002/0195056 A1 | 12/2002 | Sandhu et al. |
| 6,432,831 B2 | 8/2002 | Dhindsa et al. | 2002/0195201 A1 | 12/2002 | Beer |
| 6,435,865 B1 | 8/2002 | Tseng et al. | 2002/0197402 A1 | 12/2002 | Chiang et al. |
| 6,444,039 B1 | 9/2002 | Nguyen | 2003/0000473 A1 | 1/2003 | Chae et al. |
| 6,450,117 B1 | 9/2002 | Murugesh et al. | 2003/0003697 A1 | 1/2003 | Agarwal et al. |
| 6,451,119 B2 | 9/2002 | Sneh et al. | 2003/0003730 A1 | 1/2003 | Li |
| 6,458,416 B1 | 10/2002 | Derderian et al. | 2003/0013320 A1 | 1/2003 | Kim et al. |
| 6,461,436 B1 | 10/2002 | Campbell et al. | 2003/0023338 A1 | 1/2003 | Chin et al. |
| 6,461,931 B1 | 10/2002 | Eldridge | 2003/0024477 A1 | 2/2003 | Okuda et al. |
| 6,503,330 B1 | 1/2003 | Sneh et al. | 2003/0027428 A1 | 2/2003 | Ng et al. |
| 6,506,254 B1 | 1/2003 | Bosch et al. | 2003/0027431 A1 | 2/2003 | Sneh et al. |
| 6,509,280 B2 | 1/2003 | Choi | 2003/0037729 A1 | 2/2003 | DeDontney et al. |
| 6,534,007 B1 | 3/2003 | Blonigan et al. | 2003/0037730 A1 | 2/2003 | Yamasaki et al. |
| 6,534,395 B2 | 3/2003 | Werkhoven et al. | 2003/0060030 A1 | 3/2003 | Lee et al. |
| 6,540,838 B2 | 4/2003 | Sneh et al. | 2003/0066483 A1 | 4/2003 | Lee et al. |
| 6,541,353 B1 | 4/2003 | Sandhu et al. | 2003/0070609 A1 | 4/2003 | Campbell et al. |
| 6,551,929 B1 | 4/2003 | Kori et al. | 2003/0070617 A1 | 4/2003 | Kim et al. |
| 6,562,140 B1 | 5/2003 | Bondestam et al. | 2003/0070618 A1 | 4/2003 | Campbell et al. |
| 6,562,141 B2 | 5/2003 | Clarke | 2003/0075273 A1 | 4/2003 | Kilpela et al. |
| 6,573,184 B2 | 6/2003 | Park | 2003/0079686 A1 | 5/2003 | Chen et al. |
| 6,579,372 B2 | 6/2003 | Park | 2003/0098372 A1 | 5/2003 | Kim |
| 6,579,374 B2 | 6/2003 | Bondestam et al. | 2003/0098419 A1 | 5/2003 | Ji et al. |
| 6,596,085 B1 | 7/2003 | Schmitt et al. | 2003/0106490 A1 | 6/2003 | Jallepally et al. |
| 6,602,346 B1 | 8/2003 | Gochberg | 2003/0121608 A1 | 7/2003 | Chen et al. |
| 6,622,104 B2 | 9/2003 | Wang et al. | 2003/0159780 A1 | 8/2003 | Carpenter et al. |
| 6,630,201 B2 | 10/2003 | Chiang et al. | 2003/0192645 A1 | 10/2003 | Liu |
| 6,635,965 B1 | 10/2003 | Lee et al. | 2003/0194862 A1 | 10/2003 | Mardian et al. |
| 6,638,672 B2 | 10/2003 | Deguchi | 2003/0200926 A1 | 10/2003 | Dando et al. |
| 6,638,879 B2 | 10/2003 | Hsieh et al. | 2003/0203109 A1 | 10/2003 | Dando et al. |
| 6,641,673 B2 | 11/2003 | Yang | 2004/0003777 A1 | 1/2004 | Carpenter et al. |
| 6,663,713 B1 | 12/2003 | Robles et al. | 2004/0007188 A1 | 1/2004 | Burkhart et al. |
| 6,666,982 B2 | 12/2003 | Brcka | 2004/0035358 A1 | 2/2004 | Basceri et al. |
| 6,673,196 B1 | 1/2004 | Oyabu | 2004/0040502 A1 | 3/2004 | Basceri et al. |
| 6,704,913 B2 | 3/2004 | Rossman | 2004/0040503 A1 | 3/2004 | Basceri et al. |
| 6,705,345 B1 | 3/2004 | Bifano | 2004/0083959 A1 | 5/2004 | Carpernter et al. |
| 6,706,334 B1 | 3/2004 | Kobayashi et al. | 2004/0083960 A1 | 5/2004 | Dando |
| 6,770,145 B2 | 8/2004 | Saito | 2004/0083961 A1 | 5/2004 | Basceri |
| 6,807,971 B2 | 10/2004 | Saito et al. | 2004/0089240 A1 | 5/2004 | Dando et al. |
| 6,814,813 B2 | 11/2004 | Dando et al. | 2004/0099377 A1 | 5/2004 | Newton et al. |
| 6,818,249 B2 | 11/2004 | Derderian | 2004/0124131 A1 | 7/2004 | Aitchison et al. |
| 6,821,347 B2 | 11/2004 | Carpenter et al. | 2004/0154538 A1 | 8/2004 | Carpenter et al. |
| 6,838,114 B2 | 1/2005 | Carpenter et al. | 2004/0226507 A1 | 11/2004 | Carpenter et al. |
| 6,849,131 B2 * | 2/2005 | Chen et al. ............... 118/715 | 2004/0238123 A1 | 12/2004 | Becknell et al. |
| 6,861,094 B2 | 3/2005 | Derderian et al. | 2005/0016956 A1 | 1/2005 | Liu et al. |
| 6,881,295 B2 * | 4/2005 | Nagakura ............ 156/345.33 | 2005/0016984 A1 | 1/2005 | Dando |
| 2001/0010309 A1 | 8/2001 | Van Bilsen | 2005/0022739 A1 | 2/2005 | Carpenter et al. |
| 2001/0011526 A1 | 8/2001 | Doering et al. | 2005/0028734 A1 | 2/2005 | Carpenter et al. |
| 2001/0012697 A1 | 8/2001 | Mikata | 2005/0039680 A1 | 2/2005 | Beaman et al. |
| 2001/0024387 A1 | 9/2001 | Raajimakers et al. | 2005/0039686 A1 | 2/2005 | Zheng et al. |
| 2001/0029892 A1 | 10/2001 | Cook et al. | 2005/0045100 A1 | 3/2005 | Derderian |
| 2001/0045187 A1 | 11/2001 | Uhlenbrock | 2005/0059261 A1 | 3/2005 | Basceri et al. |
| 2001/0050267 A1 | 12/2001 | Hwang et al. | 2005/0081786 A1 | 4/2005 | Kubista et al. |

| | | | |
|---|---|---|---|
| 2005/0087130 | A1 | 4/2005 | Derderian |
| 2005/0087302 | A1 | 4/2005 | Mardian |
| 2005/0217582 | A1 | 10/2005 | Kim et al. |

FOREIGN PATENT DOCUMENTS

| | | | |
|---|---|---|---|
| EP | 1 167 569 A1 | 1/2002 | |
| JP | 63-256460 A | 10/1988 | |
| JP | 1-273991 A | 11/1989 | |
| JP | 4-100533 A | 4/1992 | |
| JP | 4-213818 A | 8/1992 | |
| JP | 6-151558 A | 5/1994 | |
| JP | 6-342785 A | 12/1994 | |
| JP | 8-34678 A | 2/1996 | |
| JP | 9-82650 A | 3/1997 | |
| JP | 63-20490 A | 1/1998 | |
| JP | 10-223719 A | 8/1998 | |
| JP | 11-172438 A | 6/1999 | |
| JP | 2001-82682 A | 3/2001 | |
| JP | 2001-261375 A | 9/2001 | |
| JP | 2002-164336 A | 6/2002 | |
| JP | 2001-254181 A | 9/2002 | |
| RU | 598630 | 3/1978 | |
| WO | WO-98/37258 A1 | 8/1998 | |
| WO | WO-99/06610 A1 | 2/1999 | |
| WO | WO-00/40772 A1 | 7/2000 | |
| WO | WO-00/63952 A1 | 10/2000 | |
| WO | WO-00/65649 A1 | 11/2000 | |
| WO | WO-00/79019 A1 | 12/2000 | |
| WO | WO-01/32966 A1 | 5/2001 | |
| WO | WO-01/46490 A1 | 6/2001 | |
| WO | WO 02/45871 A1 | 6/2002 | |
| WO | WO-02/48427 A1 | 6/2002 | |
| WO | WO-02/073329 A2 | 9/2002 | |
| WO | WO-02/073660 A2 | 9/2002 | |
| WO | WO-02/081771 A2 | 10/2002 | |
| WO | WO-02/095807 A2 | 11/2002 | |
| WO | WO-03/008662 A2 | 1/2003 | |
| WO | WO-03/016587 A1 | 2/2003 | |
| WO | WO-03/028069 A2 | 4/2003 | |
| WO | WO-03/033762 A1 | 4/2003 | |
| WO | WO-03/035927 A2 | 5/2003 | |
| WO | WO-03/052807 A1 | 6/2003 | |

OTHER PUBLICATIONS

U.S. Appl. No. 11/027,825, filed Dec. 29, 2004 Derderian et al.
U.S. Appl. No. 10/933,604, filed Sep. 2, 2004 Carpenter et al.
U.S. Appl. No. 10/839,316, filed May 5, 2004 Saragiannis et al.
U.S. Appl. No. 10/814,573, filed Mar. 31, 2004 Gealy et al.
U.S. Appl. No. 11/043,629, filed Jan. 25, 2005 Rueger et al.
U.S. Appl. No. 11/018,142, filed Dec. 20, 2004 Rueger et al.
U.S. Appl. No. 10/840,571, filed May 6, 2004 Dando et al.
U.S. Appl. No. 10/859,883, filed Jun. 2, 2004 Miller et al.
U.S. Appl. No. 10/733,523, filed Oct. 10, 2003 Beaman et al.
U.S. Appl. No. 11/027,809, filed Dec. 29, 2004 Carpenter et al.
U.S. Appl. No. 09/651,037, filed Aug. 30, 2000 Mardian.
U.S. Appl. No. 10/365,085, filed Feb. 11, 2003 Carpenter et al.
U.S. Appl. No. 10/665,908, filed Sep. 18, 2003 Sarigiannis et al.
Integrated Process Systems Ltd., "ALD & CVD", 2 pages, retrieved from the Internet on Dec. 11, 2001, <http://www.ips-tech.com/eng/pro-p2-2.htm>.
Deublin Company, "Rotating Unions", 1 page, retrieved from the Internet on Feb. 4, 2002, <http://www.com/products/rotatingunions.htm>.
Cameron, I., "Atomic Layer Deposition Chamber Works at Low Temperatures", 2 pages, Electronic Times, Jul. 19, 2001, <http://www.electronictimes.com/story/OEG20010719S0042>.
Cutting Edge Optronics, 600W QCW Laser Diode Array, Part Number: ARR48P600, 2 pages, Oct. 2001, <www.ceolaser.com>.
Henning, A.K., et al., "Microfluidic MEMS for Semiconductor Processing," IEEE Trans. Components, Packaging, and Manufacturing Technology B21, pp. 329-337, 1998.

Fitch, J.S., et al., "Pressure-Based Mass-Flow Control Using Thermopneumatically-Actuated Microvalves," Proceedings, Sensors and Actuators Workshop, pp. 162-165 (Transducers Research Foundation, Cleveland, OH, 1998).
Henning, A.K., "Liquid and gas-liquid phase behavior in thermopneumatically actuated microvalves," Proceedings, Micro Fluidic Devices and Systems (SPIE, Bellingham, WA, 1998; A.B. Frazier and C.H. Ahn, eds.), vol. 3515, pp. 53-63.
Henning, A.K., et al., "Performance of MEMS-Based Gas Distribution and Control Systems for Semiconductor Processing", 8 pages, Proceedings, SEMICON West Workshop on Gas Distribution (SEMI, Mountain View, CA, 1998).
Maillefer, D., et al., "A High-Performance Silicon Micropump for Disposable Drug Delivery Systems," pp. 413-417, IEEE, 2001.
Henning, A.K., et al., "A thermopneumatically actuated microvalve for liquid expansion and proportional control", Proceedings, TRANSDUCERS'97: 1997 International Solid State Sensors and Actuators Conference, pp. 825-828.
University of California, Berkeley, University Extension, "Atomic Layer Deposition," 5 pages, Sep. 24-25, 2001, <http://www.unex.berkeley.edu/eng/br225/1-1.html>.
Engelke, F., et al., "Determination of Phenylthiohydantoin-Amino Acids by Two-Step Laser Sesorption/Multiphoton Ionization," Analytical Chemistry, vol. 59, No. 6, pp. 909-912, Mar. 15, 1987, The American Chemical Society.
Cowin, J.P., et al., "Measurement of Fast Desorption Kinetics of D2 From Tungsten By Laser Induced Thermal Desorption ," Surface Science, vol. 78, pp. 545-564, 1978, North-Holland Publishing Company.
Ready, J.F., "Effects Due to Absorption of Laser Radiation," Journal of Applied Physics, vol. 36, No. 2, pp. 462-468, Feb. 1965, Journal of Applied Physics, American Institute of Physics.
Zare, R.N., et al. "Mass Spectrometry of Molecular Adsorbates Using Laser Desorption/Laser Multiphoton Ionization," Bulletin of the Chemical Society of Japan, vol. 61, No. 1, pp. 87-92, Jan. 1988.
Tokyo Electron Limited, Plasma Process System, Trias SPA, 1 page, retrieved from the internet on Oct. 16, 2004, <http://www.tel.com/products/spe/sdtriasspa.htm>.
Olsson, A., "Valve-less Diffuser Micropumps", ISSN 0281-2878, 66 pages, 1998.
Bardell, R.L., et al., "Designing High-Performance Micro-Pumps Based on No-Moving-Parts Valves", DSC-Vol. 62/HTD-Vol. 354, Microelectromechanical Systems (MEMS) ASME 1997, pp. 47-53.
Henning, A.K., et al., "Performance of MEMS-Based Gas Distribution and Control Systems for Semiconductor Processing," Proceedings, Micromachined Devices and Components (SPIE, Bellingham, WA, 1998; P.J. French and K. Chau, eds.), vol. 3514, pp. 159-170.
Henning, A.K. et al., "Contamination Reduction Using MEMS-Based, High-Precision Mass Flow Controllers," Proceedings, SEMICON West Symposium on Contamination Free Manufacturing for Semiconductor Processing (SEMI, Mountain View, CA 1998), pp. 1-11.
Henning, A.K., "Microfluidic MEMS," Proceedings, IEEE Aerospace Conference, Paper 4.906 (IEEE Press, Piscataway, NJ, 1998), 16 pages.
Peters, L., "Thermal Processing's Tool of Choice: Single-Wafer RTP or Fast Ramp Batch?" Semiconductor International, Apr. 1, 1998, 8 pages, <http://www.e-incite.net/semiconductor/index.asp?alyout+article&articleid=CA163937>.
The University of Adelaide, Australia, Department of Chemistry, "Spectroscopy", 2 pages, retrieved from the Internet on Feb. 9, 2002, <http://www.chemistry.adelaide.edu.au/external/Soc-Rel/Content/spectros.htm>.
Deublin Company, "Sealing," 2 pages, retrieved from the Internet on Feb. 4, 2004 <http://www.deublin.com/products/sealing.htm>.
Deublin Company, "Precision Rotating Connections for Water, Steam, Air, Hydraulic, Vacuum, Coolant and Hot Oil Service," 1 page, retrieved from the Internet on Feb. 4, 2002, <http://www.deublin.com>.

Integrated Process Systems Ltd., "Nano-ALD", 2 pages, retrieved from the Internet on Dec. 11, 2001, <http://www.ips-tech.com/eng/pro-p2.htm>.

Integrated Process Systems Ltd., "Welcome to IPS Ltd.", 1 page, retrieved from the Internet on Dec. 11, 2001, <http://www.ips-tech.com/eng/main.htm>.

Takahashi, K et al., "Process Integration of 3D Chip Stack with Vertical Interconnection," pp. 601-609, 2004 Electronic Components and Technology Conference, IEEE, Jun. 2004.

International Search Report and Written Opinion for PCT/US2004/027012, 10 pages, Nov. 11, 2004.

* cited by examiner

MICROFEATURE WORKPIECE PROCESSING APPARATUS AND METHODS FOR BATCH DEPOSITION OF MATERIALS ON MICROFEATURE WORKPIECES

TECHNICAL FIELD

The present invention is related to equipment and methods for processing microfeature workpieces, e.g., semiconductor wafers. Aspects of the invention have particular utility in connection with batch deposition of materials on microfeature workpieces, such as by atomic layer deposition or chemical vapor deposition.

BACKGROUND

Thin film deposition techniques are widely used in the manufacturing of microfeatures to form a coating on a workpiece that closely conforms to the surface topography. In the context of microelectronic components, for example, the size of the individual components in the devices on a wafer is constantly decreasing, and the number of layers in the devices is increasing. As a result, the density of components and the aspect ratios of depressions (e.g., the ratio of the depth to the size of the opening) are increasing. The size of such wafers is also increasing to provide more real estate for forming more dies (i.e., chips) on a single wafer. Many fabricators are currently transitioning from 200 mm to 300 mm workpieces, and even larger workpieces will likely be used in the future. Thin film deposition techniques accordingly strive to produce highly uniform conformal layers that cover the sidewalls, bottoms, and corners in deep depressions that have very small openings.

One widely used thin film deposition technique is chemical vapor deposition (CVD). In a CVD system, one or more precursors that are capable of reacting to form a solid thin film are mixed in a gas or vapor state, and then the precursor mixture is presented to the surface of the workpiece. The surface of the workpiece catalyzes the reaction between the precursors to form a solid thin film at the workpiece surface. A common way to catalyze the reaction at the surface of the workpiece is to heat the workpiece to a temperature that causes the reaction.

Although CVD techniques are useful in many applications, they also have several drawbacks. For example, if the precursors are not highly reactive, then a high workpiece temperature is needed to achieve a reasonable deposition rate. Such high temperatures are not typically desirable because heating the workpiece can be detrimental to the structures and other materials already formed on the workpiece. Implanted or doped materials, for example, can migrate within silicon workpieces at higher temperatures. On the other hand, if more reactive precursors are used so that the workpiece temperature can be lower, then reactions may occur prematurely in the gas phase before reaching the intended surface of the workpiece. This is undesirable because the film quality and uniformity may suffer, and also because it limits the types of precursors that can be used.

Atomic layer deposition (ALD) is another thin film deposition technique. FIGS. 1A and 1B schematically illustrate the basic operation of ALD processes. Referring to FIG. 1A, a layer of gas molecules A coats the surface of a workpiece W. The layer of A molecules is formed by exposing the workpiece W to a precursor gas containing A molecules, and then purging the chamber with a purge gas to remove excess A molecules. This process can form a monolayer of A molecules on the surface of the workpiece W because the A molecules at the surface are held in place during the purge cycle by physical adsorption forces at moderate temperatures or chemisorption forces at higher temperatures. The layer of A molecules is then exposed to another precursor gas containing B molecules. The A molecules react with the B molecules to form an extremely thin layer of solid material C on the workpiece W. The chamber is then purged again with a purge gas to remove excess B molecules.

FIG. 2 illustrates the stages of one cycle for forming a thin solid layer using ALD techniques. A typical cycle includes (a) exposing the workpiece to the first precursor A, (b) purging excess A molecules, (c) exposing the workpiece to the second precursor B, and then (d) purging excess B molecules. The purge process typically comprises introducing a purge gas, which is substantially non-reactive with either precursor, and exhausting the purge gas and excess precursor from the reaction chamber in a pumping step. In actual processing, several cycles are repeated to build a thin film on a workpiece having the desired thickness. For example, each cycle may form a layer having a thickness of approximately 0.5–1.0 Å, and thus it takes approximately 60–120 cycles to form a solid layer having a thickness of approximately 60 Å.

One drawback of ALD processing is that it has a relatively low throughput compared to CVD techniques. For example, ALD processing typically takes several seconds to perform each A-purge-B-purge cycle. This results in a total process time of several minutes to form a single thin layer of only 60 Å. In contrast to ALD processing, CVD techniques only require about one minute to form a 60 Å thick layer. In single-wafer processing chambers, ALD processes can be 500%–2000% longer than corresponding single-wafer CVD processes. The low throughput of existing single-wafer ALD techniques limits the utility of the technology in its current state because ALD may be a bottleneck in the overall manufacturing process.

One promising solution to increase the throughput of ALD processing is processing a plurality of wafers (e.g., 20–250) simultaneously in a batch process. FIG. 3 schematically illustrates a conventional batch ALD reactor 10 having a processing enclosure 20 coupled to a gas supply 30 and a vacuum 40. The processing enclosure 20 generally includes an outer wall 22 and an annular liner 24. A platform 60 seals against the outer wall or some other part of the enclosure 20 via a seal 62 to define a process chamber 25. Gas is introduced from the gas supply 30 to the process chamber 25 by a gas nozzle 32 that introduces gas into the main chamber 28 of the process chamber 25. Under influence of the vacuum 40, the gas introduced via the gas nozzle 32 will flow through the main chamber 28 and outwardly into the annular exhaust 26 to be drawn out with a vacuum 40. A plurality of workpieces W, e.g., semiconductor wafers, may be held in the processing enclosure in a workpiece holder 70. In operation, a heater 50 heats the workpieces W to a desired temperature and the gas supply 30 delivers the first precursor A, the purge gas, and the second precursor B as discussed above in connection with FIG. 2.

However, when depositing material simultaneously on a large number of workpieces in an ALD reactor 10 such as that shown in FIG. 3, it can be difficult to uniformly deposit the precursors A and B across the surface of each of the workpieces W. Removing excess precursor from the spaces between the workpieces W can also be problematic. In an ALD reactor such as that shown in FIG. 3, the primary mechanism for removing residual precursor that is not chemisorbed on the surface of one of the workpieces is diffusion. This is not only a relatively slow process that significantly reduces the throughput of the reactor 10, but it also may not adequately remove residual precursor. As such, conventional batch ALD reactors may have a low throughput and form non-uniform films.

DETAILED DESCRIPTION

A. Overview

Figure 1A:
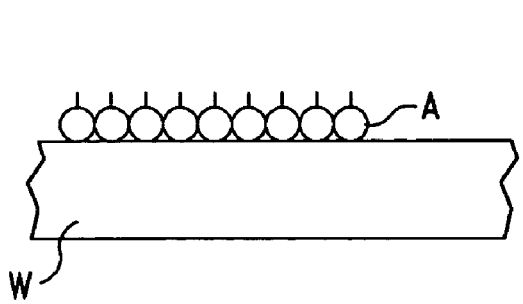
FIGS. 1A and 1B are schematic cross-sectional views of stages in ALD processing in accordance with the prior art.

Various embodiments of the present invention provide microfeature workpiece holders, systems including processing chambers, and methods for depositing materials onto microfeature workpieces. Many specific details of the invention are described below with reference to reactors for depositing materials onto microfeature workpieces. The term "microfeature workpiece" is used throughout to include substrates upon which and/or in which microelectronic devices, micromechanical devices, data storage elements, read/write components, and other devices are fabricated. For example, microfeature workpieces can be semiconductor wafers such as silicon or gallium arsenide wafers, glass substrates, insulative substrates, and many other types of materials. The microfeature workpieces typically have submicron features with dimensions of 0.05 microns or greater. Furthermore, the term "gas" is used throughout to include any form of matter that has no fixed shape and will conform in volume to the space available, which specifically includes vapors (i.e., a gas having a temperature less than the critical temperature so that it may be liquefied or solidified by compression at a constant temperature). Several embodiments in accordance with the invention are set forth in FIGS. 4–17 and the following text to provide a thorough understanding of particular embodiments of the invention. A person skilled in the art will understand, however, that the invention may have additional embodiments, or that the invention may be practiced without several of the details of the embodiments shown in FIGS. 4–17.

Certain embodiments of the invention provide microfeature workpiece holders that are adapted to hold a plurality of microfeature workpieces, e.g., for chemical processing such as ALD. These workpiece holders may include a gas distributor comprising one or more gas delivery conduits. The gas delivery conduit may have an inlet and a plurality of outlets, which may be positioned to direct a flow of process gas into the spaces between the workpieces. This can facilitate more uniform distribution of reaction precursors on a microfeature workpiece surface, for example. The distribution of these outlets may also facilitate rapid and effective purging of the space between the workpieces.

Other embodiments of the invention provide microfeature workpiece processing systems that may include an enclosure defining a process chamber, a removable microfeature workpiece holder disposed in the processing chamber, and a process gas supply conduit. The workpiece holder may be similar to the workpiece holders described above and include a gas distributor having outlets adapted to direct a flow of gas from the process gas supply between the microfeature workpieces.

Other embodiments of the invention provide methods of depositing materials on microfeature workpieces. Although a number of methods are described below, one method having particular utility in connection with ALD includes positioning a microfeature workpiece holder in a process chamber, with the microfeature workpiece holder supporting a plurality of workpieces to define process spaces between each pair of adjacent workpieces. A first precursor gas may be delivered to the process chamber to deposit a quantity of the first precursor gas on a surface of each of the microfeature workpieces. A purge gas may be delivered to the microfeature workpiece holder. The microfeature workpiece holder may carry a gas distributor that delivers a first flow of the purge gas transversely into the space between a pair of workpieces and delivers a second flow of the purge gas transversely into a process space between another pair of workpieces. The method may further include delivering a second precursor gas to the process chamber; the second precursor gas reacts with the quantity of the first precursor gas to form a layer of material on the surfaces of the workpieces.

For ease of understanding, the following discussion is subdivided into three areas of emphasis. The first section discusses microfeature workpiece holders in accordance with selected embodiments of the invention. The second section describes aspects of microfeature workpiece processing systems in other embodiments of the invention. The third section discusses outlines methods in accordance with other aspects of the invention.

B. Microfeature Workpiece Holders

FIGS. 4–8 schematically illustrate a microfeature workpiece holder 100 in accordance with one embodiment of the invention. This microfeature workpiece holder 100 generally includes a base 110, a plurality of columns 120, and a cap 150. The particular embodiment shown in FIGS. 4–8 employs 3 columns, namely columns 120a, 120b and 120c. The base 110 and the cap 150 are each generally semicircular in shape and the columns 120a–c are spaced approximately 90° from one another so that the two outer columns 120a and 120c are generally diametrically opposed to one another. It should be recognized that this is simply one possible embodiment that may be useful in connection with microfeature workpieces that are generally circular in shape. In other embodiments, more or fewer columns 120 may be employed. In addition, the base 110 and/or the cap 150 may take the form of a solid plate or disk or have any other desired shape. In other embodiments, only one of the base 110 or cap 150 is employed. For example, the cap 150 may be omitted and the base 110 may provide the requisite support for the columns 120.

Each of the columns 120 in the microfeature workpiece holder 100 is generally circular in cross-section. In other embodiments, the columns may have other shapes. For example, the columns 120 may be generally wedge-shaped, such as those suggested in PCT International Publication No. WO 02/095807 entitled, "Silicon Fixtures Useful for High Temperature Wafer Processing," the teachings of which are incorporated herein by reference.

Figure 4:
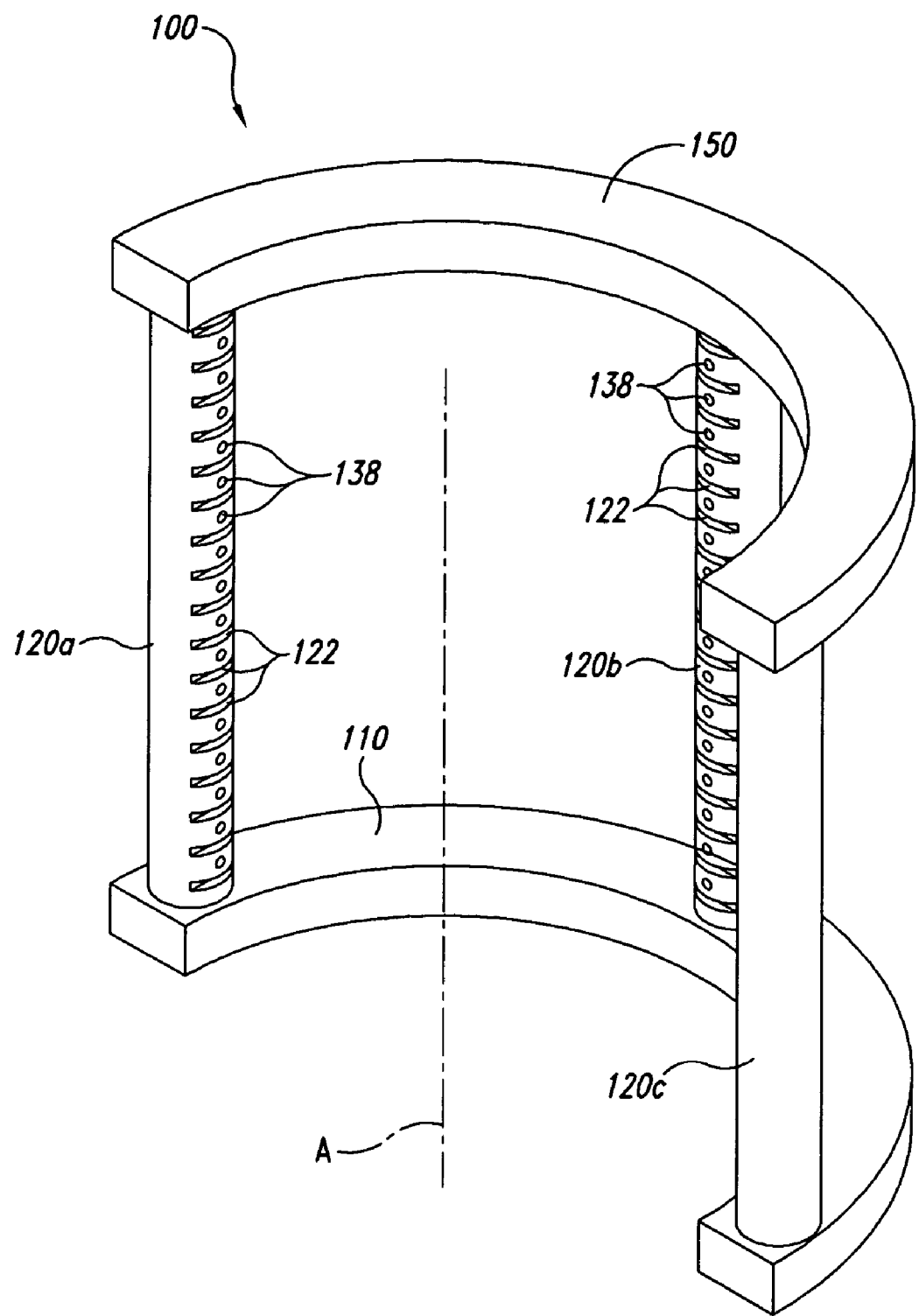
FIG. 4 is an isometric view of a microfeature workpiece holder in accordance with one embodiment of the invention.
Figure 5:
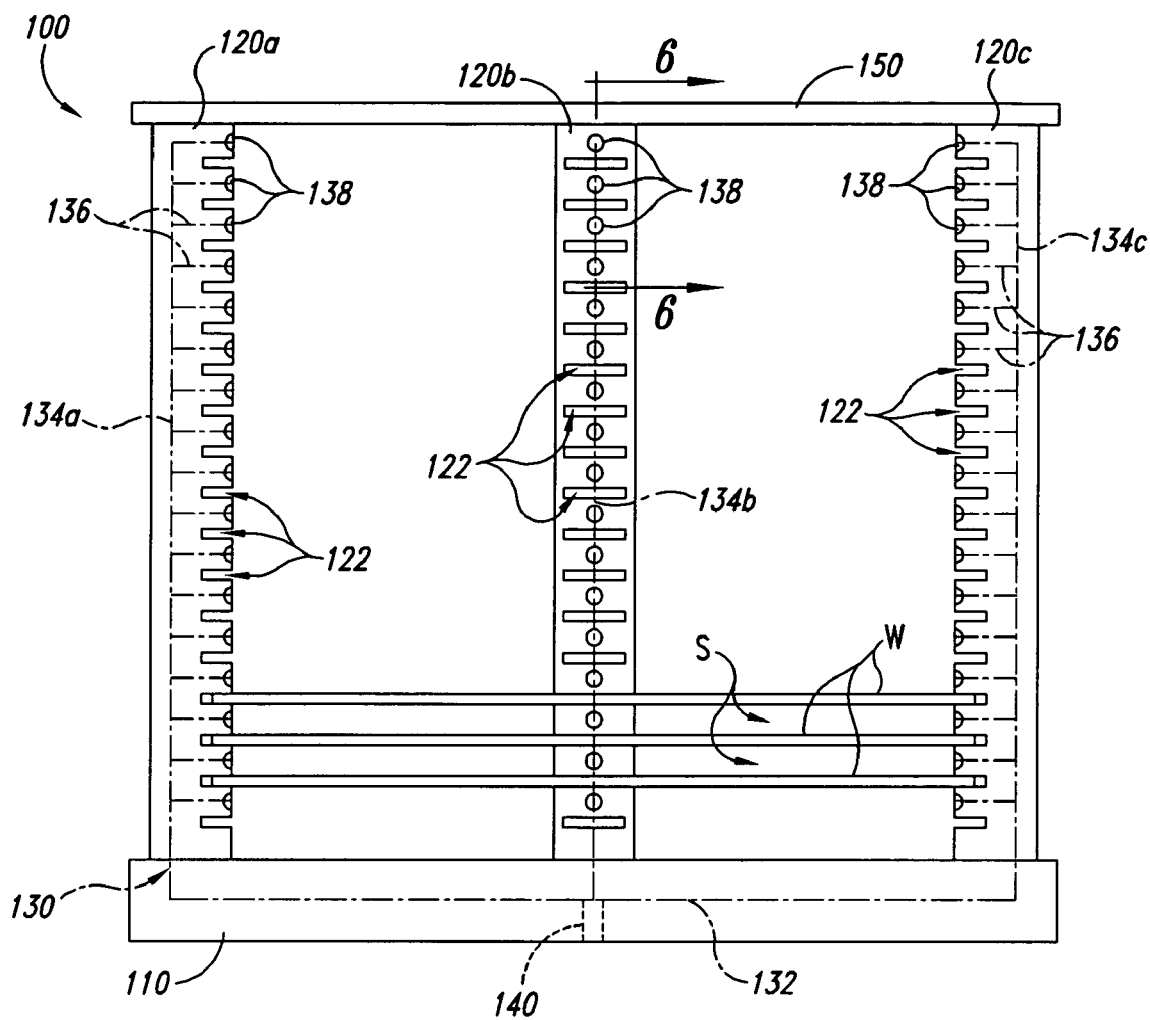
FIG. 5 is a side elevation view of the microfeature workpiece holder of FIG. 4.

Each of the columns 120 includes a plurality of workpiece supports spaced longitudinally along its length. In the illustrated embodiment, these workpiece supports comprise slots 122 that extend into the body of the column 120. In other embodiments, the workpiece holders may comprise inwardly-extending fingers, rings, clamps, or other workpiece-supporting structures known in the art, e.g., supports used in semiconductor wafer handling and processing equipment. FIGS. 4 and 5 show columns with a limited number of slots 122. Depending on the application in which the workpiece holder 100 is used, the columns 120 may include fewer or more slots.

The size and shape of the slots 122 can be modified as desired. In one embodiment, each of the slots 122 is adapted to receive an edge portion of one of the microfeature workpieces (as suggested in FIG. 5). A single slot 122 may not be deep enough to receive a sufficient portion of a microfeature workpiece W to support the workpiece W. In the illustrated embodiment, the slots 122 on each of the columns 120a–c are positioned relative to one another to cooperatively support the workpieces W. As illustrated in FIG. 5, each slot 122 may be generally horizontally aligned with a corresponding one of the slots 122 on each of the other two columns 120. This permits a workpiece W to be supported at three separate peripheral locations to enhance the support of each of the workpieces W. If these slots 122 are spaced the same distance along the length of each of the columns 120, the slots 122 may support a plurality of microfeature workpieces W in a spaced-apart, generally parallel relationship. The spaced-apart relationship of the workpieces W will define a process space S between each of the workpieces W.

As shown schematically in FIG. 5, the microfeature workpiece holder 100 also includes a gas distributor 130. This gas distributor 130 includes at least one gas delivery conduit 134 adapted to direct a flow of process gas relative to the workpieces W. In one embodiment, a single gas delivery conduit 134 is employed. In the particular embodiment shown schematically in FIG. 5, the gas distributor 130 includes a manifold 132 connecting a plurality of gas delivery conduits 134a–c. The manifold 132 may comprise an arcuate fluid passageway formed in the arcuate base 110 that provides fluid communication between a gas inlet 140 in the base 110 and each of the gas delivery conduits 134a–c. In the illustrated embodiment, a separate gas delivery conduit 134 is associated with each of the columns 120. Hence, a first gas delivery conduit 134a is carried by the first column 120a, a second gas delivery conduit 134b is carried by a second column 120b, and a third gas delivery conduit 134c is carried by the third column 120c. In some embodiments, one or more of the columns 120 may not include a gas delivery conduit 134. In other embodiments, more than one gas delivery conduit 134 may be carried by each column 120.

Figure 6:
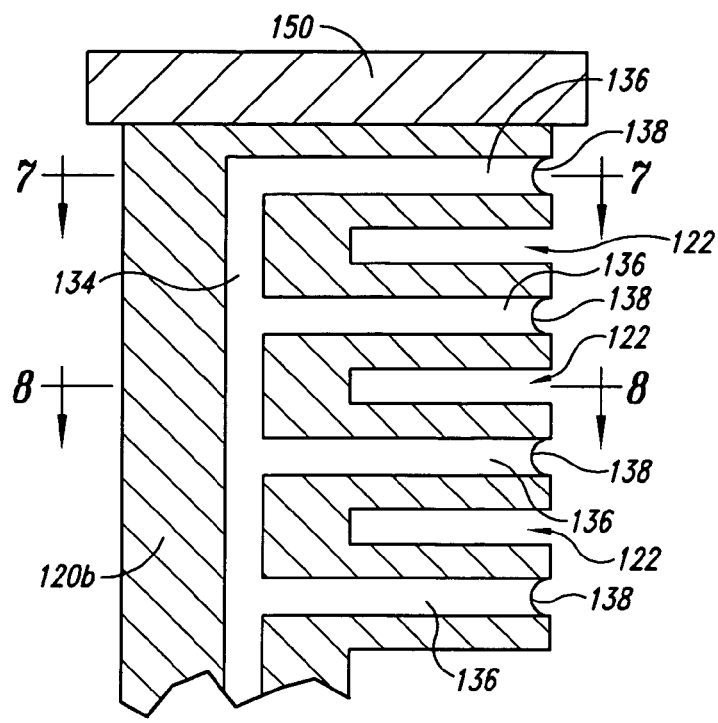
FIG. 6 is a schematic cross-sectional view of the microfeature workpiece holder of FIGS. 4 and 5 taken along line 6—6 of FIG. 5.
Figures 7, 8:
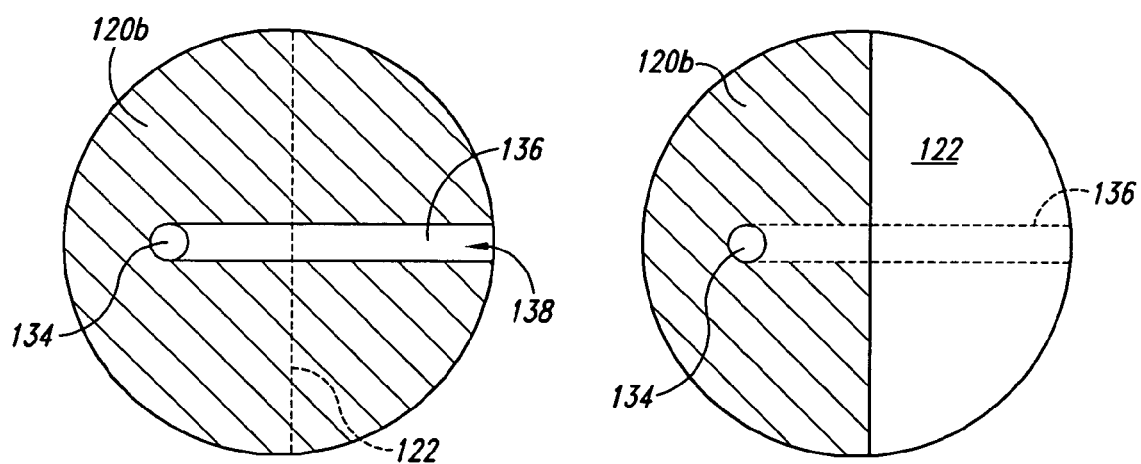
FIG. 7 is a schematic cross-sectional view of the microfeature workpiece holder of FIGS. 4–6 taken along line 7—7 of FIG. 6.
FIG. 8 is a schematic cross-sectional view of the microfeature workpiece holder of FIGS. 4–7 taken along line 8—8 of FIG. 6.

As best seen in FIGS. 6–8, the gas delivery conduit 134b may comprise an internal lumen formed in the second column 120b. (Although FIGS. 6–8 only illustrate the second column 120b, the structure of the other columns 120a and 120c may be substantially the same. Hence, the following discussion generically refers to a column 120 and a gas delivery conduit 134.) The gas delivery conduit 134 includes a plurality of transverse passages 136, each of which directs fluid from the gas delivery conduit 134 to one of a plurality of outlets 138. These outlets 138 are disposed between two adjacent slots 122. The gas delivery conduit 134, including each of the transverse passages 136 is generally circular in cross-section and the outlets 138 define generally circular openings. The size and shape of the gas delivery conduits 134 and outlets 138 in the microfeature workpiece holder 100 can be varied, though. In other embodiments, for example, the outlets 138 may comprise ellipses or slots having a transverse dimension longer than a longitudinal dimension or include a directional nozzle (not shown).

When the microfeature workpieces W are loaded in the microfeature workpiece holder 100, they will define a series of process spaces S. At least one outlet 138 is desirably associated with each of these process spaces S. In the illustrated embodiment, one outlet 138 is positioned between each pair of adjacent slots 122 on each of the columns 120a–c. As a consequence, three outlets 138 are associated with each process space, with one outlet being associated with each of the columns 120a–c supporting the workpieces W. Directing transverse gas flows into the processing spaces S can further enhance the flow of process gas from the gas distributor 130 into and through the processing spaces S.

Referring back to FIG. 4, each of the outlets 138 may be directed inwardly toward a central axis A (in FIG. 4) of the microfeature workpiece holder 100. Consequently, when the workpieces W are positioned in the holder 100, each of the outlets 138 will be positioned to direct a flow of process gas inwardly toward a center of one of the workpieces W. This is expected to further enhance the uniformity of material deposition and/or decrease the time needed to purge the system.

The microfeature workpiece holder 100 can be formed of any material that is suitable in light of the microfeature workpieces W with which it will be used and the anticipated conditions of use. If the microfeature workpieces W comprise semiconductor wafers, for example, the microfeature workpiece holder 100 may be formed from glass, fused silica (e.g., fused quartz), or polysilicon (i.e., polycrystalline silicon), among other materials. For other types of applications that may be less sensitive to contamination, the microfeature workpiece holder 100 may be formed of a metal, a ceramic, or a suitably stiff and durable polymeric material.

Figure 9:
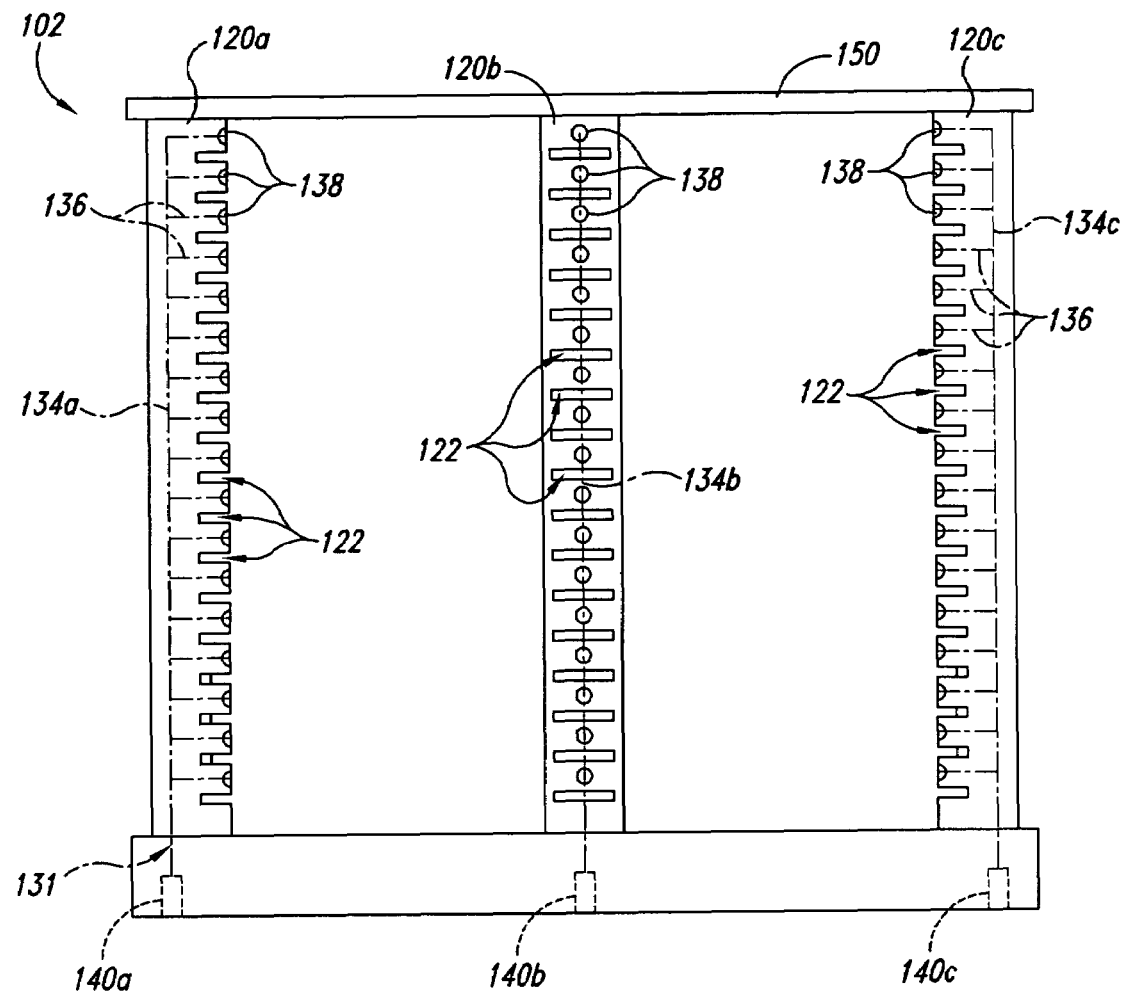
FIG. 9 is a schematic side elevation view of a microfeature workpiece holder in accordance with another embodiment of the invention.
Figure 10:
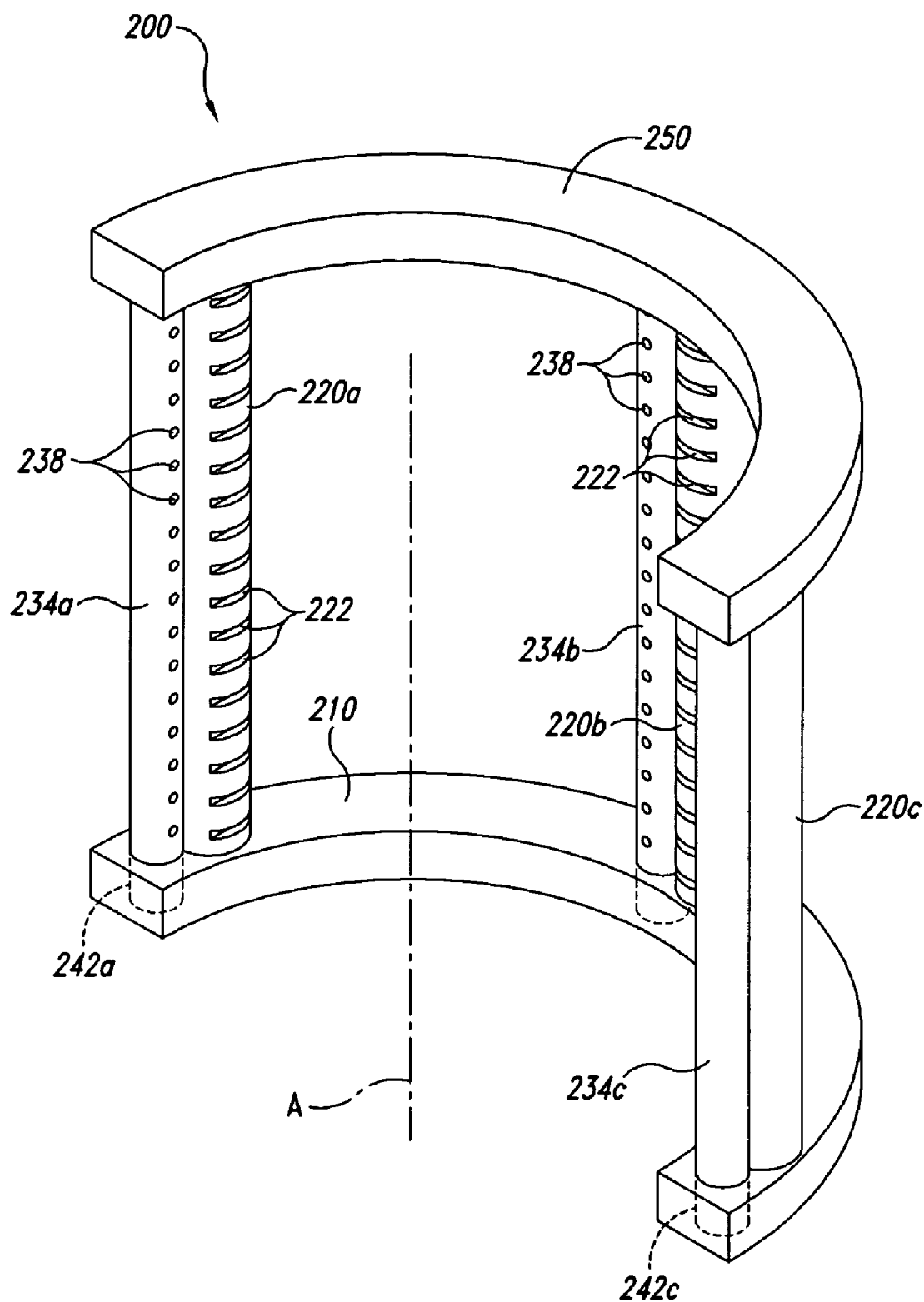
FIG. 10 is a schematic isometric view of a microfeature workpiece holder in accordance with yet another embodiment of the invention.

FIG. 9 schematically illustrates a microfeature workpiece holder 102 in accordance with another embodiment of the invention. This microfeature workpiece holder 102 is similar in many respects to the microfeature workpiece holder 100 shown in FIGS. 4–8 and like reference numbers are used in FIGS. 4–9 to illustrate like elements.

Figure 1B:
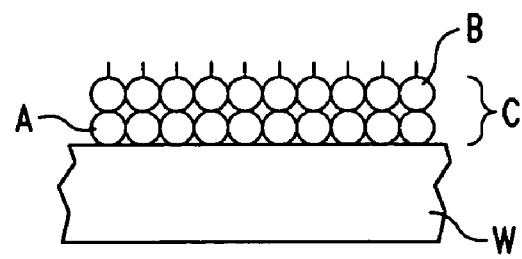
Figure 2:
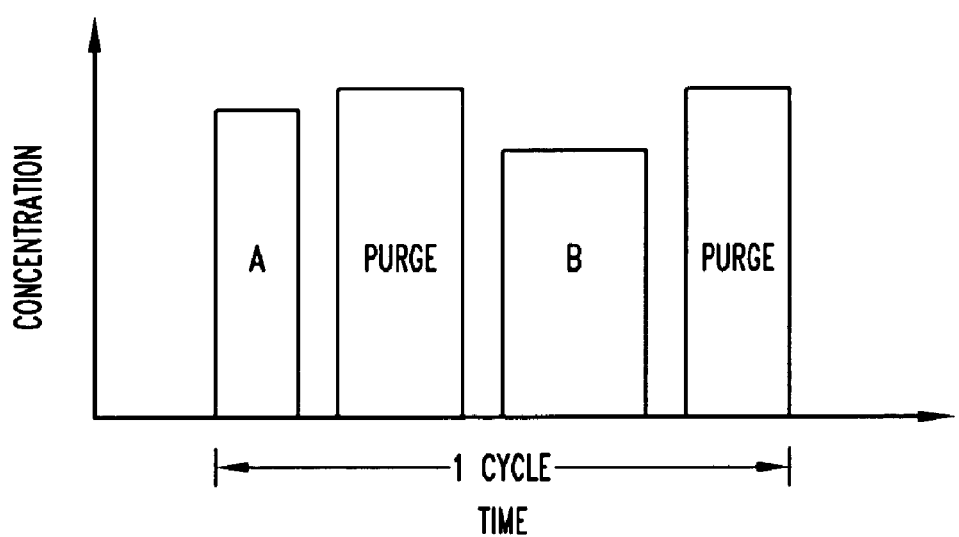
FIG. 2 is a graph illustrating a cycle for forming a layer using ALD techniques in accordance with the prior art.

One difference between the microfeature workpiece holders 100 and 102 relates to the design of the gas distributor. The gas distributor 130 shown in FIG. 5 employs a single gas inlet 140 that communicates with each of the gas delivery conduits 134a–c through a common manifold 132. The microfeature workpiece holder 102 of FIG. 9 does not include a manifold 132. Instead, the gas distributor 131 in FIG. 9 has a separate gas inlet 140 for each of the gas delivery conduits 134. Hence, one inlet 140a is in fluid communication with a first one of the gas delivery conduits 134a, a second gas inlet 140b is in fluid communication with a second gas delivery conduit 134b, and a third gas inlet 140c is in fluid communication with a third gas delivery conduit 134c. In this design, each of the gas delivery conduits 134 may be adapted to deliver a process gas flow that is independent of the process gas flow delivered through each of the other conduits 134. As noted below, this may permit a different process gas to be delivered through each of the conduits 134a–c. In the context of the ALD process outlined above in connection with FIGS. 1 and 2, for example, one of the gas delivery conduits (e.g., conduit 134a) may be dedicated to delivering the first precursor gas A, a second one of the gas delivery conduits (e.g., conduit 134b) may be used to deliver the second precursor gas B, and the third gas delivery conduit 134c may be used to deliver the purge gas.

FIGS. 10–14 schematically illustrate a microfeature workpiece holder 200 in accordance with another embodiment of the invention. This microfeature workpiece holder 200 generally includes a base 210, a cap 250, and at least one column 220 extending between the base 210 and the cap 250. The illustrated embodiment employs three columns 220a–220c that are spaced generally equiangularly in a manner similar to that described above in connection with the microfeature workpiece holder 100 of FIG. 4. Each of the columns 220a–c may include a series of longitudinally-spaced slots 222 oriented inwardly toward a central axis A of the microfeature workpiece holder 200. Each of these slots 222 may be adapted to receive an edge portion of a microfeature workpiece W (omitted in FIGS. 10–14 for ease of understanding). Each of the slots 222 in a particular column 220 may be positioned relative to a corresponding slot 222 in each of the other columns 220 so the three corresponding slots 222 can cooperatively support a microfeature workpiece W.

One of the differences between the microfeature workpiece holders 100 and 200 of FIGS. 4–8 and 10–14, respectively, relates to the relationship of the gas distributor to the columns of the workpiece holder. In the workpiece holder 100 of FIGS. 4–8, the gas distributor 130 includes several gas delivery conduits 134, each of which comprises an internal lumen of one of the columns 120. The microfeature workpiece holder 200 of FIGS. 10–14, in contrast, has substantially solid columns 220. As suggested in FIGS. 12 and 14, the columns 220 may have a solid interior with a series of spaced-apart slots 222 formed in an inwardly-oriented surface of the column.

Figure 11:
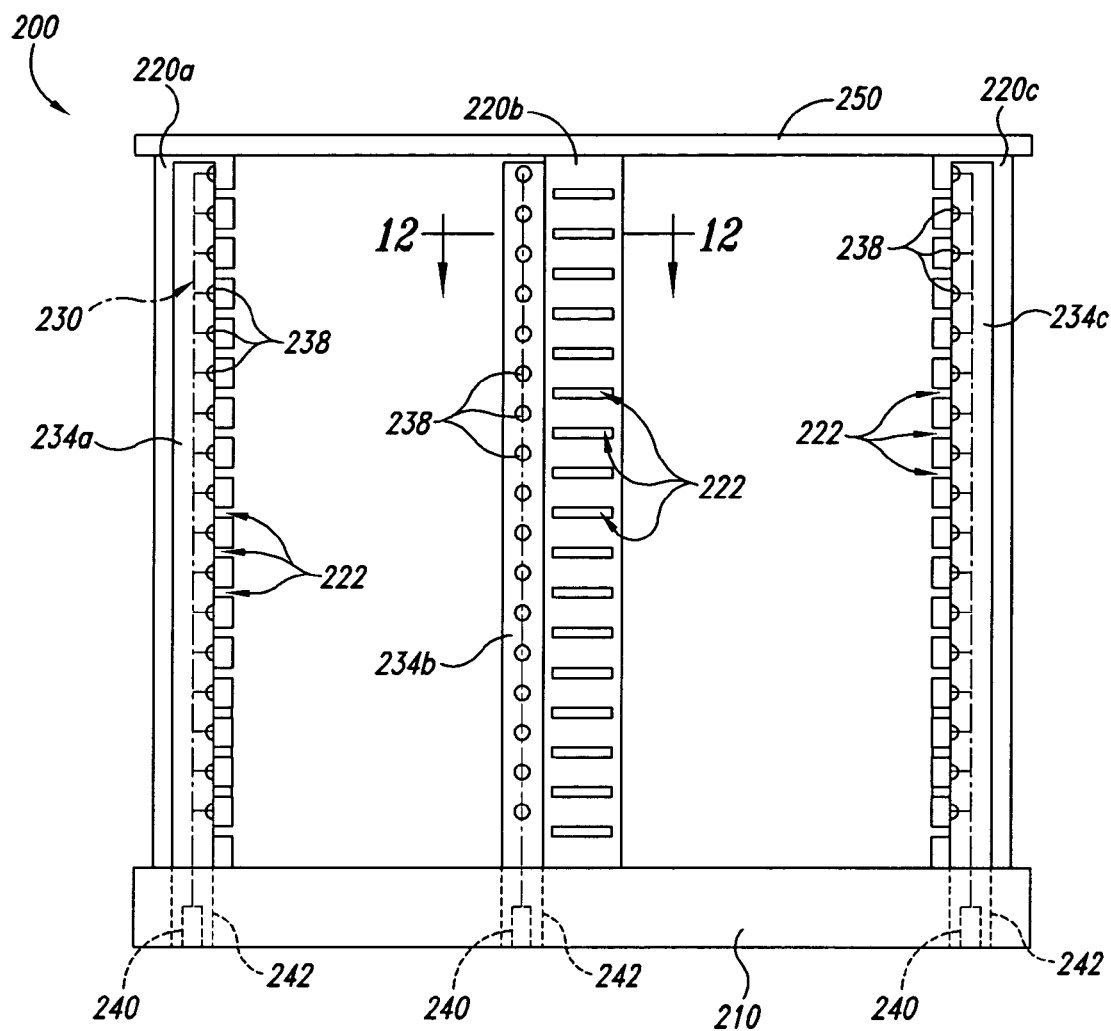
FIG. 11 is a schematic side elevation view of the microfeature workpiece holder of FIG. 10.
Figure 12:
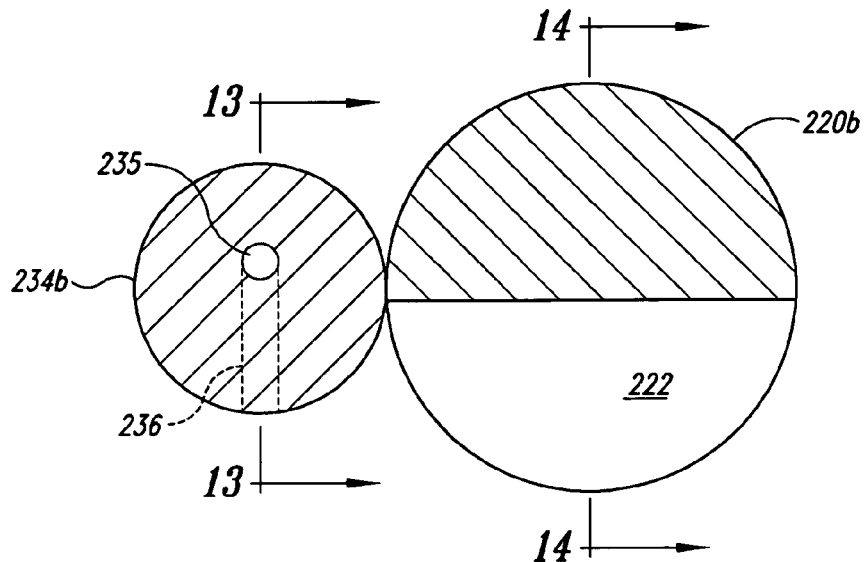
FIG. 12 is a schematic cross-sectional view of the microfeature workpiece holder of FIGS. 10 and 11 taken along line 12—12 of FIG. 11.

Referring to FIG. 11, the microfeature workpiece holder 200 also includes a gas distributor, generally designated as reference number 230, that includes a series of gas delivery conduits 234. In particular, a first gas delivery conduit 234a is carried with respect to the first column 220a, a second gas delivery conduit 234b is carried with respect to a second column 220b, and a third gas delivery conduit 234c is carried with respect to a third column 220c. The position of each of the gas delivery conduits 234 may be fixed relative to the adjacent column 220 in any desired fashion. In one embodiment, the gas delivery conduits 234 may be supported entirely by the base 210 and/or the cap 250. In the particular embodiments shown in FIGS. 10 and 11, a base portion 242 of each of the conduits 234 is received within and passes through an opening in the base 210, but the opposite end of the gas delivery conduit 234 is spaced from the cap 250. In another embodiment, each of the conduits 234 is attached to the cap 250, as well. As shown in FIGS. 11 and 12, each of the gas delivery conduits 234 in the illustrated embodiment is positioned immediately adjacent to one of the columns 220. In such an arrangement, each of the conduits 234 may be attached to or otherwise physically supported by the adjacent column 220. In other embodiments (not shown), the conduits 234 may be attached only to an adjacent column 220 without being directly attached to the base 210 or the cap 250. In still other embodiments, the gas delivery conduits 234 need not be positioned close to any of the columns 220. For example, one gas delivery conduit 234 may be positioned between the first two columns 220a and 220b and a second gas delivery conduit 234 may be positioned between the second and third columns 220b and 220c.

Figure 13:
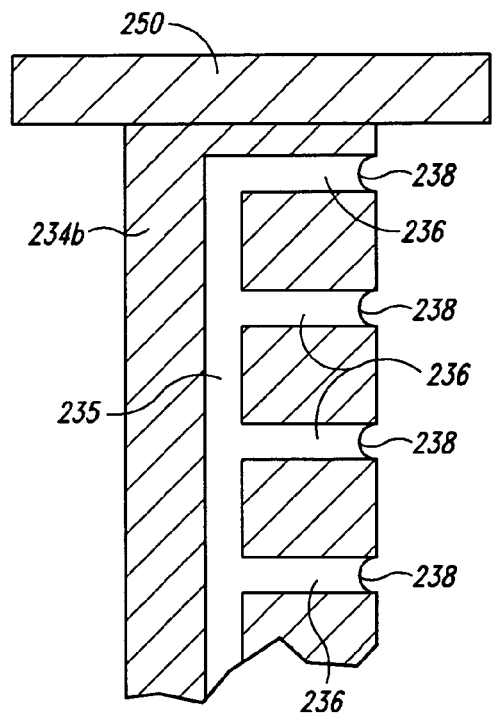
FIG. 13 is a schematic cross-sectional view of a portion of the microfeature workpiece holder of FIGS. 10–12 taken along line 13—13 of FIG. 12.
Figure 14:
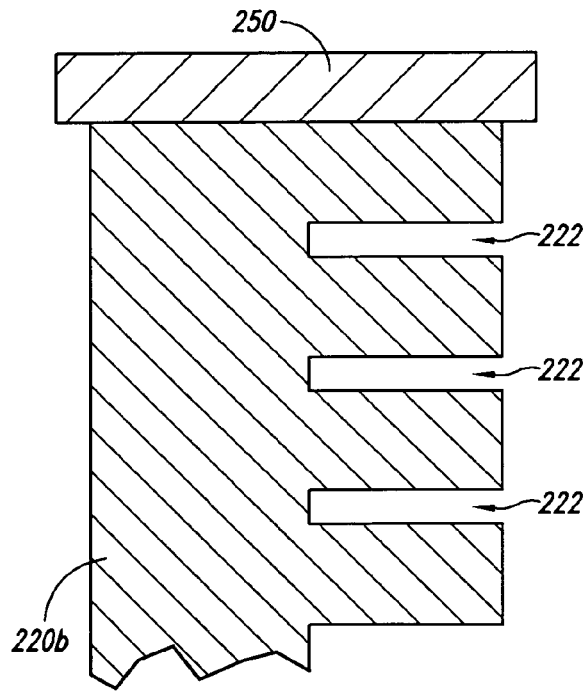
FIG. 14 is a schematic cross-sectional view of a portion of microfeature workpiece holder of FIGS. 10–13 taken along line 14—14 of FIG. 12.

The gas delivery conduits 234 provide a fluid pathway between a gas inlet 240 and a plurality of gas outlets 238. As illustrated in FIG. 13, the gas delivery conduits 234 (in this case, gas delivery conduit 234b) may include a longitudinally extending channel 235 and a series of transverse pathways 236 extending transversely inwardly toward the axis (axis A in FIG. 10) of the microfeature workpiece holder 200. The outlets 238 of these pathways 236 may be positioned laterally along the length of the respective conduit 234 so each outlet 238 can direct a flow of process gas intermediate a pair of adjacent slots 222. When the microfeature workpieces W (not shown in FIGS. 10 and 11) are positioned in the microfeature workpiece holder 200, these outlets 238 would, therefore, direct a flow of process gas into the process space (S in FIG. 5) defined between two adjacent microfeature workpieces W.

The gas distributor 230 of FIGS. 10–14 includes a separate gas inlet 240 for each of the gas delivery conduits 234. In an alternative embodiment, two or more of the gas delivery conduits 234 may communicate with a common inlet 240 via a manifold (not shown) in the base 210, similar to the manifold 132 in the microfeature workpiece holder 100 discussed above.

C. Microfeature Workpiece Processing Systems

Figure 15:
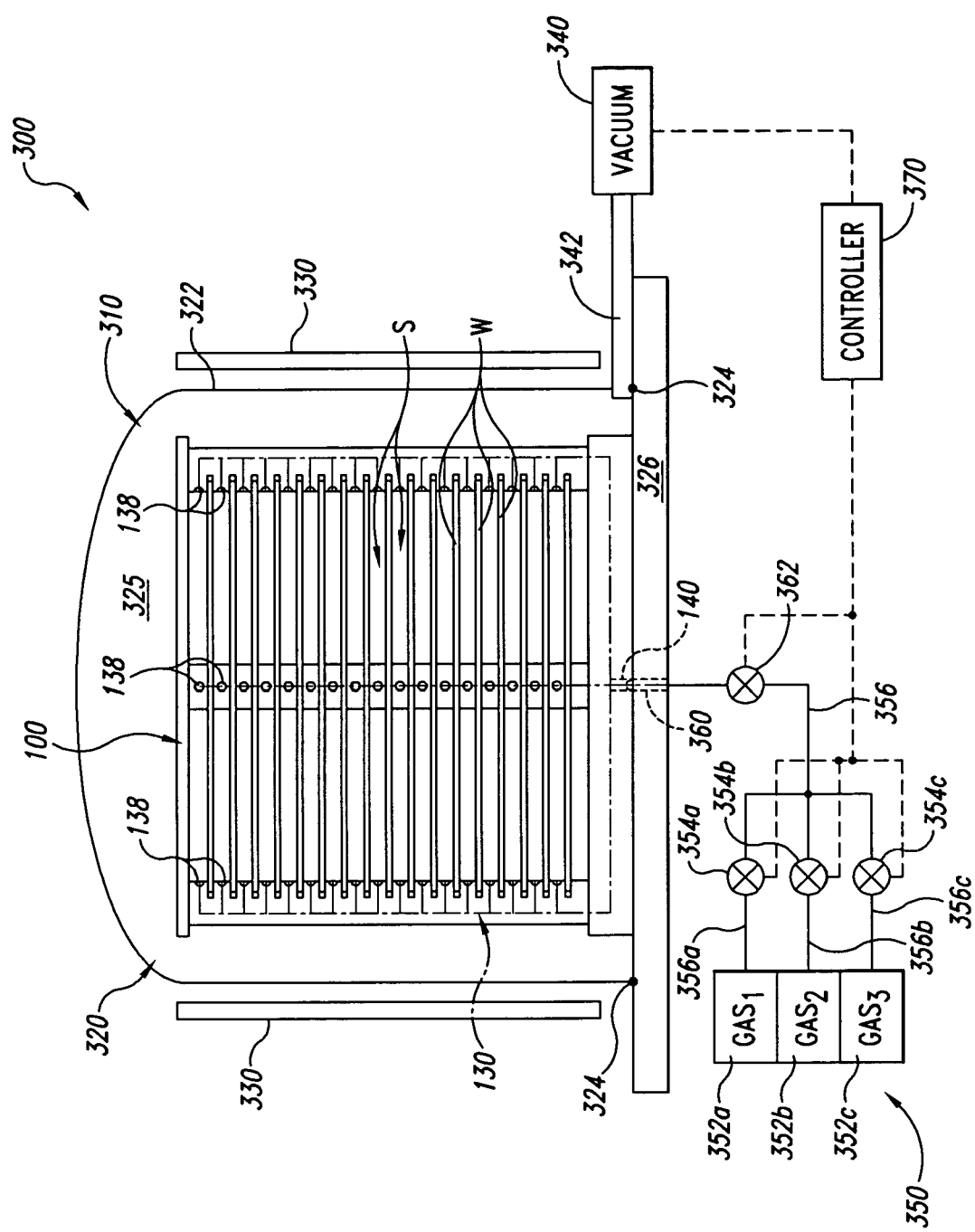
FIG. 15 is a schematic illustration of a microfeature workpiece processing system in accordance with a further embodiment of the invention.
Figure 16:
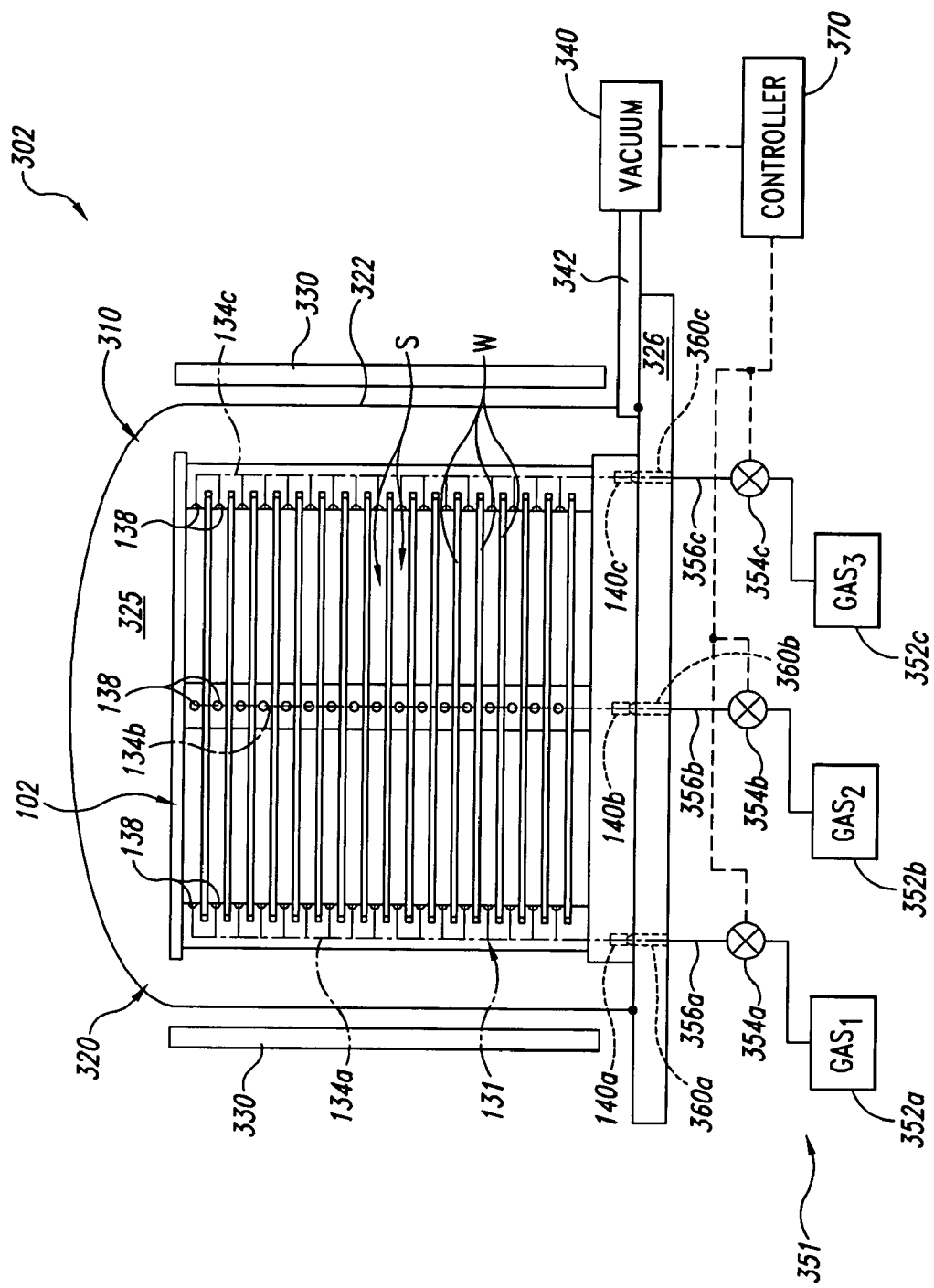
FIG. 16 is a schematic illustration of a microfeature workpiece processing system in accordance with another embodiment of the invention.
Figure 17:
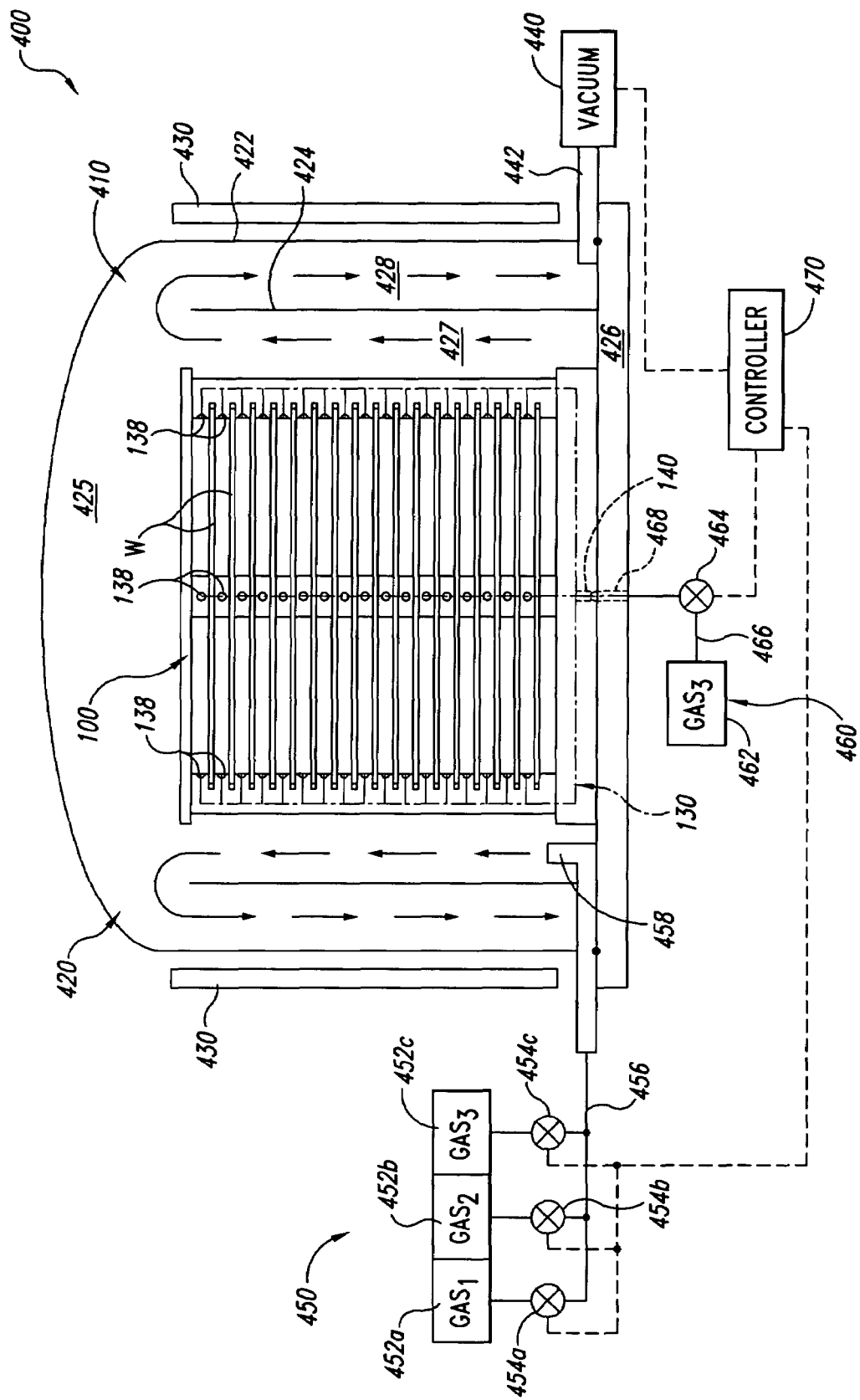
FIG. 17 is a schematic illustration of a microfeature workpiece processing system in accordance with yet another embodiment of the invention.

The microfeature workpiece holders 100, 102, and 200 may be used for a variety of processes. FIGS. 15–17 schematically illustrate select microfeature workpiece processing systems that employ microfeature workpiece holders to process a batch of microfeature workpieces simultaneously. The microfeature workpiece holders employed in these processing systems may, in select embodiments, employ features of the microfeature workpiece holders 100, 102, and/or 200 described above.

FIG. 15 schematically illustrates a microfeature workpiece processing system 300 in accordance with one embodiment of the invention. This system 300 includes a reactor 310 adapted to receive a plurality of microfeature workpieces W in a holder. In the specific embodiment shown in FIG. 15, the workpieces W are carried in a workpiece holder 100 substantially as described above in connection with FIGS. 4–8.

The reactor 310 generally includes an enclosure 320 defined by a wall 322 and a holder-supporting platform 326. The wall 322 may sealingly engage the platform 326, illustrated schematically in FIG. 15 as an O-ring seal 324. This will define a process chamber 325 within which the microfeature workpiece holder 100 may be received. The reactor 310 may also include a heater 330 and a vacuum 340 that communicates with the process chamber 325 by a vacuum line 342. The heater 330 may be of any conventional design, e.g., an inductance heater or the like.

A gas supply system 350 of the reactor 310 generally includes a plurality of individual gas supplies 352, with at least one gas supply 352 provided for each of the process gases used in processing workpieces W in the system 300. The illustrated embodiment includes a first gas supply 352a to deliver a first gas ($GAS_1$), a second gas supply 352b adapted to deliver a second gas ($GAS_2$), and a third gas supply 352c adapted to deliver a third gas ($GAS_3$). In the context of ALD such as that discussed above in connection with FIGS. 1 and 2, the first gas supply 352a may provide a supply of the first precursor A, the second gas supply 352b may provide a supply of the second precursor B, and the third gas supply 352c may provide a supply of the purge gas. Each of the individual gas supplies 352a–c may be provided with an individual gas supply line 356a–c, respectively. These individual supply lines 356a–c are coupled to a primary gas supply line 356. In the illustrated embodiment, each of the individual gas supply lines 356a–c is provided with a selectively controllable secondary valve 354a–c, respectively. These secondary valves may be used to control the flow rate of the gas from each of the individual gas supply 352 into the main gas supply line 356, hence regulating the composition and flow rate of gas to the gas supply line 356.

The gas distributor 130 of the holder 100 may be coupled to the gas supply system 350 in a variety of manners. In the schematic illustration of FIG. 15, a gas fitting 360 in the platform 326 may be releasably coupled to the gas inlet 140 of the holder 100. This fitting 360 is coupled to the remainder of the gas supply 350 by a supply line 356.

The flow of gas through the supply line 356 to the gas distributor 130 of the holder 100 may be controlled, at least in part, by a main valve 362 that is under the control of a controller 370. The controller 370 may take any of a variety of forms. In one embodiment, the controller 370 comprises a computer having a programmable processor programmed to control operation of the system 300 to deposit material on the workpieces W. The controller 370 may also be operatively coupled to the secondary valves 354a–c to control the composition of the gas delivered to the main valve 362 via the supply line 356. The controller 370 may also be coupled to the vacuum 340 (as illustrated) or any other component of the processing system 300, e.g., the heater 330.

FIG. 16 schematically illustrates a microfeature workpiece processing system 302 in accordance with an alternative embodiment of the invention. This processing system 302 is similar in many respects to the processing system 300 of FIG. 15 and like reference numbers are used in FIGS. 15 and 16 to indicate like elements. The processing system 300 uses the microfeature workpiece holder 100 of FIGS. 4–8. The workpieces W in processing system 302 of FIG. 16 are instead held in the microfeature workpiece holder 102 of FIG. 9. As noted above, the gas distributor 131 of this holder 102 has a series of independent gas delivery conduits 134, each of which has a separate gas inlet 140.

The gas supply 351 of FIG. 16 is similar in many respects to the gas supply 350 of FIG. 15. In FIG. 15, each of the individual gas supply lines 356a–c were joined into a main supply line 356 for delivery to a single gas fitting 360. In the gas supply 351 of FIG. 16, however, each of the individual gas supplies 352a–c is independently coupled to a separate gas fitting 360a–c, respectively. In particular, a first gas fitting 360a may releasably couple the first gas supply line 356a to the first inlet 140a, a second gas fitting 360b may releasably couple a second gas supply line 356b to the second gas inlet 140b, and a third gas fitting 360c may releasably couple a third gas supply line 356c to the third gas inlet 140c. The flow of gas from each of the gas supplies 352a–c may be independently controlled by a separate valve 354a–c through a common controller 370. Introducing each of the process gases through an independent, dedicated gas delivery conduit 134 can avoid the need to purge the gas delivery conduit 134 after delivering one precursor and before delivering another precursor. This may be advantageous in CVD applications because it permits the precursor gases to be introduced separately into the process chamber 325, more effectively restricting the deposition of the reactant to the vicinity of the workpieces W.

FIG. 17 illustrates a microfeature workpiece processing system 400 in accordance with still another embodiment of the invention. This processing system 400 generally includes a reactor 410 having a processing enclosure 420 within which a workpiece holder (e.g., workpiece holder 100 of FIGS. 4–8) carrying one or more workpieces W may be received. The processing enclosure 420 is generally defined by an outer wall 422 and a platform 426 adapted to carry the workpiece holder 100. This processing enclosure 420 also includes a liner 424 that functionally divides the process chamber 425 into a main chamber 427 and a generally annular exhaust 428 coupled to the vacuum 440 by a vacuum line 442. The reactor 410 may also include a heater 430.

The processing system 400 may include a first gas supply system 450 and a second gas supply system 460. The first gas supply system 450 includes a plurality of individual gas supplies 452a–c, each of which may include a separate process gas. Hence, the first gas supply 452a may include a precursor gas A ($GAS_1$) and a second gas supply 452b may provide a supply of a second precursor gas B ($GAS_2$). Optionally, the first gas supply system 450 may also include a supply of a purge gas ($GAS_3$) in a third gas supply. Each of these individual gas supplies 452a–c may be coupled to a common gas supply line 456. A separate valve 454a, 454b, or 454c may be operated by a controller 470 to control the flow of gas from the individual gas supplies 452a, 452b, and 452c, respectively.

Figure 3:
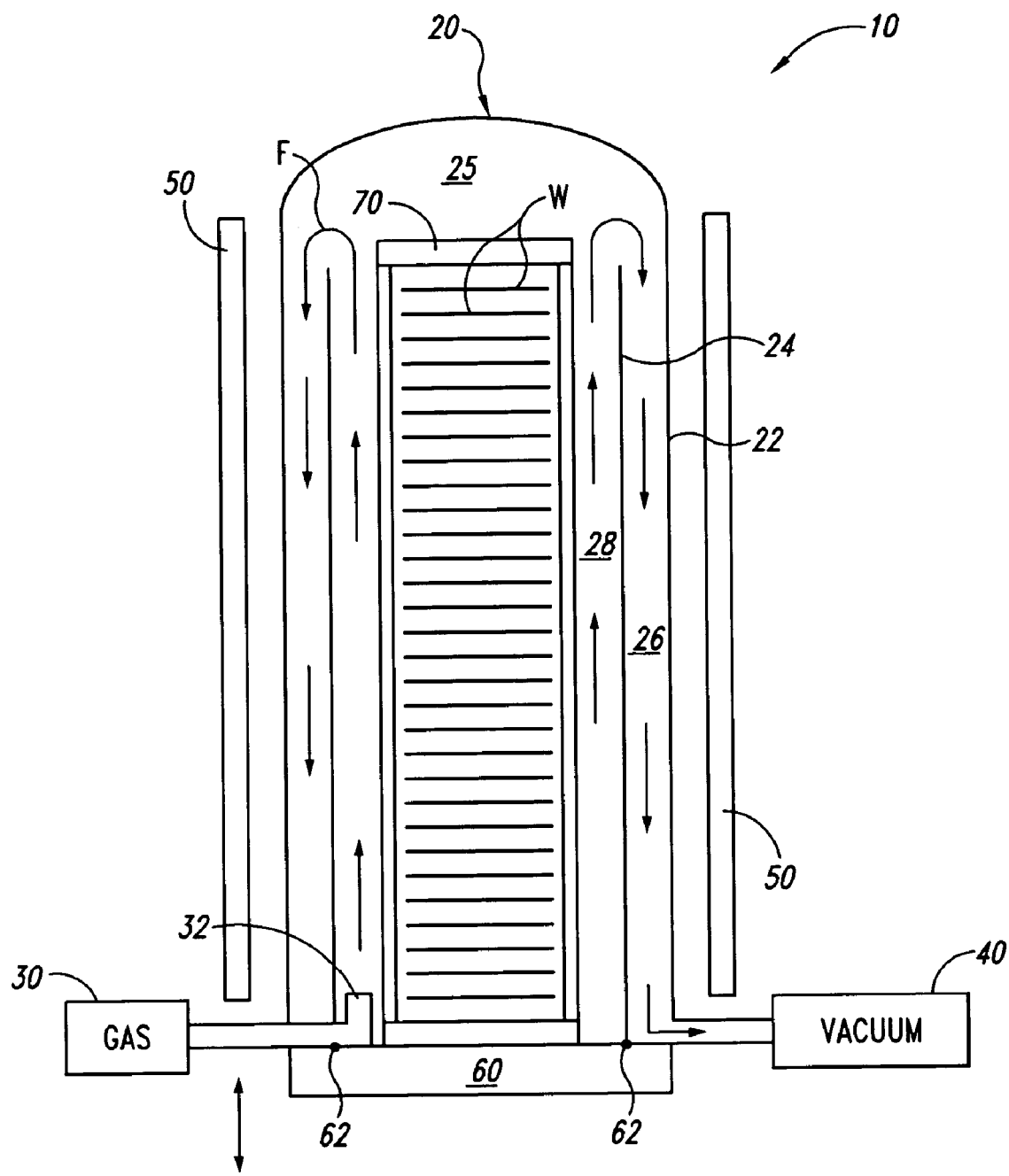
FIG. 3 is a schematic representation of a system including a reactor for depositing a material onto a microfeature workpiece in accordance with the prior art.

The gas supply line 456 of the first gas supply system 450 may be in fluid communication with one or more gas supply nozzles 458. The gas supply nozzle 458 may be adapted to deliver a flow of process gas to the main chamber 427 outside the process spaces S of the process chamber 425. This gas may flow generally longitudinally through the main chamber 427 then out of the process chamber 425 via the annular exhaust 428. This gas supply system 450 is, in some respects, analogous to the gas supply 30 and gas nozzle 32 illustrated in FIG. 3.

The microfeature workpiece processing system 400 also includes a second gas supply system 460. This gas supply system 460 may be adapted to deliver one or more process gases to the process chamber 425 via the gas distributor 130 of the workpiece holder 100. Gas will exit the outlets 138 of the gas distributor 130 in a direction transverse to the longitudinally directed flow from the nozzle 458. In the specific embodiment shown in FIG. 17, the second gas supply system 460 includes a single individual gas supply 462 containing a purge gas ($GAS_3$). The individual gas supply 462 is coupled to a gas fitting 468 in the platform 426 by a valve 464 operatively linked to the controller 470. The gas fitting 468 is adapted to be releasably coupled to the inlet 140 of the gas distributor 130. Although the second gas supply system 460 shown in FIG. 16 only provides a supply of a single purge gas, this gas supply system 460 may include two or more individual gas supplies 462 to provide a variety of different process gas compositions to the gas distributor 130.

D. Methods of Depositing Materials On Microfeature Workpieces

As noted above, other embodiments of the invention provide methods of processing microfeature workpieces. In the following discussion, reference is made to the particular microfeature workpiece processing systems 300, 302, and 400 shown in FIGS. 15–17. It should be understood, though, that reference to these particular processing systems and the workpiece holders used therein is solely for purposes of illustration and that the methods outlined below are not limited to any particular workpiece holder or processing system shown in the drawings or discussed in detail above. In addition, the following discussion focuses primarily on ALD and also touches on possible CVD applications. It should be recognized that the processes outlined below should not be limited to these specific deposition processes. Indeed, aspects of the methods outlined below may have utility in applications in which a process other than material deposition, e.g., selective etching, may be carried out.

In accordance with one embodiment, a method of processing microfeature workpieces may include positioning a microfeature workpiece holder 100 in a process chamber 325 (using the processing system 300 as an example). The workpiece holder 100 may support a plurality of workpieces W in a spaced-apart relationship to define a process space S between each pair of adjacent workpieces W. The microfeature workpiece holder 100 may be positioned in the process chamber by placing the holder 100 on a platform 326. In one embodiment, the gas fitting 360 may be coupled to the gas inlet 140 of the gas distributor 130 at this time. Once the holder 100 is in place on the platform 326, the platform 326 may be moved toward the wall 322 until the seals 324 substantially seal the enclosure 320 to define the process chamber 325.

This embodiment also includes delivering at least a first process gas and a second process gas to the process chamber 325. In one embodiment, the first process gas, e.g., a first precursor A, may be delivered to the process chamber 325 by opening the first regulator valve 354a and the main valve 362. This will allow the first gas to flow into the gas distributor 130 and outwardly into the process chamber 325 via the outlets 138. As noted above, these outlets 138 will deliver a flow of the process gas transversely into the process spaces S between the workpieces W.

The second process gas may be delivered to the process chamber 325 either simultaneously with delivery of the first process gas (e.g., for CVD) or at a different time. If the processing system 300 of FIG. 15 is used to deposit a material via ALD, for example, a flow of the first precursor gas A from the first supply 352a may be terminated by closing the valve 354a. A flow of purge gas from the third gas supply 352c may be delivered into the process spaces S by opening the associated regulator valve 154c. The regulator valve 154c may be closed and a flow of the second precursor gas B from the second gas supply 352b may then be introduced via the nozzles 138. By appropriate control of the valves 354 and 362 and the vacuum 340, the controller 370 may be used to deposit a reaction product via an ALD process such as that discussed above in connection with FIGS. 1 and 2.

Delivering process gases transversely into the process space S between the workpieces W via the outlets 138 can fairly rapidly change the gas present in the process space S. In the conventional system of FIG. 3, one of the primary mechanisms for gas exchange in the spaces between the workpieces W is diffusion. Delivering a transverse flow of gas in accordance with embodiments of the present invention can deliver a more uniform application of the precursors to be chemisorbed or reacted on the surface of the workpiece W. Delivering the purge gas through the outlets 138 will also provide a more active scrubbing of the gas in the process spaces S, helping clear the process spaces S of any excess precursor gas fairly quickly. This can materially speed up the purge phases of the process illustrated in FIG. 2.

The processing system 300 of FIG. 15 introduces process gases through a single inlet 140 and the gas distributor 130 of the workpiece holder 100. The processing system 302 of FIG. 16 allows each of the process gases ($gas_{1-3}$) to be introduced into the process chamber 325 through a separate gas delivery conduit 134a, 134b, or 134c. This can be particularly useful in both ALD and CVD applications. By separating the pathways for delivery of the reaction precursors into separate conduits 134, less care need be taken to purge the gas delivery system of the first precursor before introducing a second precursor through the same gas delivery system. In the context of CVD, the gas can be introduced separately and allowed to mix in the process space S and react in the immediate vicinity of the workpiece W. This may facilitate use of more highly reactive precursors, which may be problematic if the precursors are introduced together through a common gas delivery path.

In another specific embodiment, one of the process gases may be introduced through the gas distributor 130 of the workpiece holder 100, but the second process gas may be delivered through a delivery conduit independent of the gas distributor 130. In the context of the microfeature workpiece processing system 400 of FIG. 17, for example, the precursor gases may be introduced from separate individual gas supplies 452a and 452b through the gas delivery nozzle 458. This will deliver the precursors to the process spaces S between the workpieces W in a fashion analogous to that in the ALD reactor 10 of FIG. 3. In the purge stages illustrated in FIG. 2, though, the purge gas ($gas_3$) may be introduced through the gas distributor 130 either in addition to or instead of introducing the purge gas through the nozzle 458. Delivering the purge gas through the outlets 138 of the workpiece holder gas distributor 130 will help positively scrub the processing spaces S, fairly rapidly sweeping away any excess precursor.

Unless the context clearly requires otherwise, throughout the description and the claims, the words "comprise," "comprising," and the like are to be construed in an inclusive sense as opposed to an exclusive or exhaustive sense, that is to say, in a sense of "including, but not limited to." Words using the singular or plural number also include the plural or singular number, respectively. When the claims use the word "or" in reference to a list of two or more items, that word covers all of the following interpretations of the word: any of the items in the list, all of the items in the list, and any combination of the items in the list.

The above-detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, whereas steps are presented in a given order, alternative embodiments may perform steps in a different order. The various embodiments described herein can be combined to provide further embodiments.

In general, the terms used in the following claims should not be construed to limit the invention to the specific embodiments disclosed in the specification, unless the above-detailed description explicitly defines such terms. While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

The invention claimed is:

1. A microfeature workpiece holder adapted to hold a plurality of micro feature workpieces for chemical processing, comprising:
    a longitudinally extending member having a plurality of slots as workpiece supports spaced longitudinally along a length of the longitudinally extending member, the workpiece supports being adapted to support the plurality of microfeature workpieces such that the workpieces are with their planar surfaces in a spaced-apart and generally parallel relationship for processing; and
    a longitudinally extending gas delivery conduit formed inside and carried by the longitudinally extending member and having an inlet, a first outlet, and a second outlet spaced longitudinally from the first outlet, the first outlet being positioned to transversely flow a process gas intermediate a first pair of the workpiece supports, the second outlet being positioned to flow a process gas transversely intermediate a second pair of the workpiece supports.

2. The microfeature workpiece holder of claim 1 wherein each of the workpiece supports comprises a slot in the longitudinally extending member adapted to receive an edge portion of one of the microfeature workpieces.

3. The microfeature workpiece holder of claim 1 wherein the longitudinally extending member is a first longitudinally extending member, further comprising a second longitudinally extending member that includes a plurality of workpiece supports, each of the workpiece supports of the second longitudinally extending member being positioned relative to a workpiece support of the first longitudinally extending member to cooperatively support one of the microfeature workpieces.

4. The microfeature workpiece holder of claim 1 wherein the longitudinally extending member is a first longitudinally extending member and the gas delivery conduit is a first gas delivery conduit, further comprising a second longitudinally extending member and a second gas delivery conduit formed inside and carried by the second longitudinally extending member.

5. The microfeature workpiece holder of claim 1 wherein the longitudinally extending member is a first longitudinally extending member and the gas delivery conduit is a first gas delivery conduit that comprises an internal lumen of the first longitudinal member, further comprising a second longitudinally extending member having an internal lumen that defines a second gas delivery conduit.

6. The microfeature workpiece holder of claim 1 wherein the longitudinally extending member is a first longitudinally extending member and the gas delivery conduit is a first gas delivery conduit adapted to deliver a first process gas flow, further comprising a second longitudinally extending member and a second gas delivery conduit formed inside and carried by the second longitudinally extending member, the second gas delivery conduit being adapted to deliver a second process gas flow that is independent of the first process gas flow.

7. The microfeature workpiece holder of claim 1 wherein the gas delivery conduit comprises an internal lumen of the longitudinal member.

8. The microfeature workpiece holder of claim 1 wherein the longitudinally extending member is a first longitudinally extending member and the gas delivery conduit is a first gas delivery conduit that comprises an internal lumen of the first longitudinal member, further comprising a second longitudinally extending member having an internal lumen that defines a second gas delivery conduit.

9. The microfeature workpiece holder of claim 1 further comprising a process gas supply releasably coupled to the inlet of the gas delivery conduit.

10. The microfeature workpiece holder of claim 1 wherein the each of first and second outlets of the gas delivery conduit is positioned to direct a process gas flow inwardly toward a center of one of the plurality of microfeature workpieces when the microfeature workpieces are loaded in the microfeature workpiece holder.

11. A microfeature workpiece holder adapted to hold a plurality of microfeature workpieces, comprising:
    a first member having a plurality of slots as first workpiece supports spaced along a length of the first member, a plurality of outlets spaced along the length of the first member, and a lumen formed inside and carried by the first member and coupling an inlet to each of the outlets, wherein each of the outlets is disposed between two adjacent workpiece supports, the slots being adapted to support the plurality of the microfeature workpieces in a spaced-apart and generally parallel relationship;
    a second member having a plurality of slots as second workpiece supports that are generally horizontally aligned with corresponding slots on the first member spaced along a length of the second member, each of the second workpiece supports being positioned relative to one of the first workpiece supports to cooperatively support a workpiece;
    and at least one cross-member joined to the first and second members.

12. The microfeature workpiece holder of claim 11 wherein each of the first and second workpiece supports comprises a slot adapted to receive an edge portion of one of the microfeature workpieces.

13. The microfeature workpiece holder of claim 11 wherein the second member includes a plurality of second member outlets spaced along a length of the second member, and an internal lumen coupling a second member inlet to each of the a second member outlets.

14. The microfeature workpiece holder of claim 11 further comprising a process gas supply releasably coupled to the inlet.

15. The microfeature workpiece holder of claim 11 wherein the each of the outlets is positioned to direct a process gas flow inwardly toward a center of one of the plurality of microfeature workpieces when the microfeature workpieces are loaded in the microfeature workpiece holder.

16. A microfeature workpiece processing system, comprising:
an enclosure defining a process chamber;
a removable microfeature workpiece holder disposed in the processing chamber, the microfeature workpiece holder including:
a longitudinally extending member having a plurality of slots as workpiece supports spaced longitudinally along a length of the longitudinally extending member, the workpiece supports being adapted to support the plurality of microfeature workpieces such that the workpieces are spaced-apart with their planar surfaces in a generally parallel relationship for processing; and
a longitudinally extending gas delivery conduit formed inside and carried by the longitudinally extending member and having an inlet, a first outlet, and a second outlet spaced longitudinally from the first outlet, the first outlet being positioned to direct a process gas flow intermediate a first pair of the workpiece supports, the second outlet being positioned to direct a process gas flow intermediate a second pair of the workpiece supports; and
a process gas supply coupled to an inlet of a gas distributor of the microfeature workpiece holder.

17. The microfeature workpiece processing system of claim 16 wherein each of the workpiece supports comprises a slot in the longitudinally extending member adapted to receive an edge portion of one of the micro feature workpieces.

18. The microfeature workpiece processing system of claim 16 wherein the longitudinally extending member is a first longitudinally extending member and the gas delivery conduit is a first gas delivery conduit, and wherein the microfeature workpiece holder further comprises a second longitudinally extending member and a second gas delivery conduit formed inside and carried by the second longitudinally extending member.

19. The microfeature workpiece processing system of claim 16 wherein the gas delivery conduit comprises an internal lumen of the longitudinal member.

20. The microfeature workpiece processing system of claim 16 wherein the each of first and second outlets of the gas delivery conduit is positioned to direct a process gas flow inwardly toward a center of one of the plurality of microfeature workpieces when the microfeature workpieces are loaded in the microfeature workpiece holder.

* * * * *